United States Patent
Yi et al.

(10) Patent No.: US 11,183,555 B2
(45) Date of Patent: Nov. 23, 2021

(54) DISPLAY DEVICE

(71) Applicant: Samsung Display Co., LTD., Yongin-si (KR)

(72) Inventors: Min Seong Yi, Seoul (KR); Seung Hwan Cho, Yongin-si (KR); Tae Hyun Kim, Seoul (KR); Jong Hyun Choi, Seoul (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/729,440

(22) Filed: Dec. 29, 2019

(65) Prior Publication Data
US 2020/0258969 A1    Aug. 13, 2020

(30) Foreign Application Priority Data

Feb. 12, 2019  (KR) .................. 10-2019-0016318

(51) Int. Cl.
*H01L 27/32* (2006.01)
*G06F 3/047* (2006.01)
*G06F 3/041* (2006.01)

(52) U.S. Cl.
CPC .......... *H01L 27/3276* (2013.01); *G06F 3/047* (2013.01); *G06F 3/0412* (2013.01); *H01L 27/326* (2013.01); *H01L 27/3246* (2013.01); *G06F 2203/04107* (2013.01)

(58) Field of Classification Search
CPC . G06F 2203/04107; G06F 2203/04111; G06F 2203/04112; G06F 3/0412; G06F 3/04164; G06F 3/0443; G06F 3/0446; G06F 3/047; H01L 27/3223; H01L 27/323; H01L 27/3246; H01L 27/326; H01L 27/3272; H01L 27/3276
See application file for complete search history.

(56) References Cited

U.S. PATENT DOCUMENTS

| | | | |
|---|---|---|---|
| 10,505,147 B2 * | 12/2019 | Lee ..................... | H01L 27/3276 |
| 2016/0172428 A1 * | 6/2016 | Song ................... | H01L 27/3276 257/99 |
| 2017/0048990 A1 * | 2/2017 | Sim ........................ | H04M 1/026 |
| 2020/0210044 A1 * | 7/2020 | Kim ...................... | G06F 3/0412 |

* cited by examiner

*Primary Examiner* — Mohammed Shamsuzzaman
(74) *Attorney, Agent, or Firm* — H.C. Park & Associates, PLC

(57) ABSTRACT

A display device including a display area and a non-display area, the display device including a plurality of data wires disposed in the display area and in the non-display area, a plurality of connecting wires disposed in the display area and connected to the data wires, a plurality of dummy patterns disposed in the display area in the same layer as the connecting wires, and shielding patterns disposed on the connecting wires. First gaps are defined between the connecting wires and the dummy patterns, and the shielding patterns overlap with the first gaps.

9 Claims, 19 Drawing Sheets

DISPLAY DEVICE

This application claims priority from the benefit of Korean Patent Application No. 10-2019-0016318, filed on Feb. 12, 2019, which is incorporated by reference for all purposes as if fully set forth herein.

BACKGROUND

Field

Exemplary embodiments of the invention relate generally to a display device.

Discussion of the Background

Display devices have increasingly become of great importance with the development of multimedia. Accordingly, various display devices, such as a liquid crystal display (LCD) device, an organic light-emitting diode (OLED) display device, or the like have been developed.

Particularly, the OLED display device displays an image using OLEDs which generate light by combining electrons and holes together. The OLED display device has a fast response speed, high luminance, and wide viewing angles and can be driven at low power.

A typical display device displays images only at the front thereof, and recently, a display device capable of displaying images on the sides thereof has been developed.

The above information disclosed in this Background section is only for understanding of the background of inventive concepts, and, therefore, it may contain information that does not constitute prior art.

SUMMARY

Exemplary embodiments of the invention provide a display device capable of minimizing the size of a non-display area and preventing degradation of display quality.

Additional features of the inventive concepts will be set forth in the description which follows, and in part will be apparent from the description, or may be learned by practice of the inventive concepts.

An exemplary embodiment of the invention provides a display device including a display area and a non-display area, the display device including a plurality of data wires disposed in the display area and in the non-display area, a plurality of connecting wires disposed in the display area and connected to the data wires, a plurality of dummy patterns disposed in the display area in the same layer as the connecting wires, and shielding patterns disposed on the connecting wires. First gaps are defined between the connecting wires and the dummy patterns, and the shielding patterns overlap with the first gaps.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
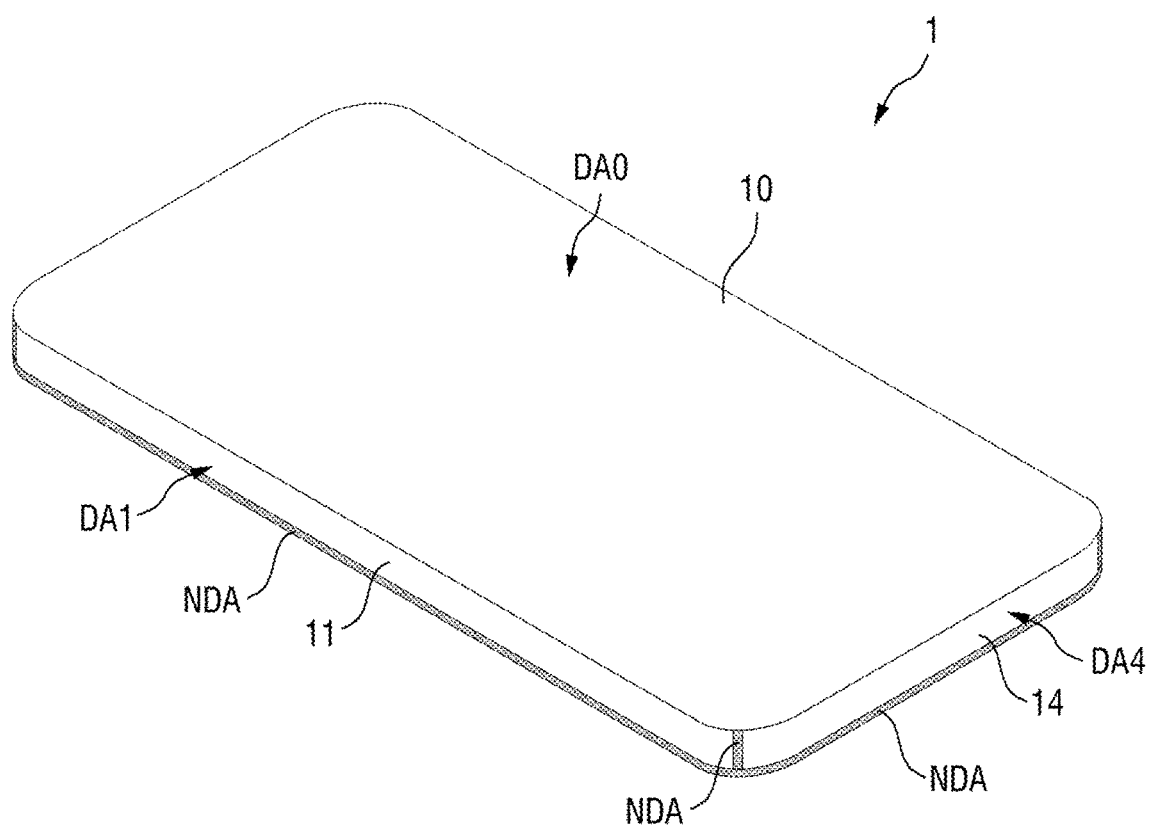
FIG. 1 is a perspective view of a display device according to an exemplary embodiment of the invention.

Features of the inventive concept and methods of accomplishing the same may be understood more readily by reference to the following detailed description of exemplary embodiments and the accompanying drawings. The inventive concept may, however, be embodied in many different forms and should not be construed as being limited to the exemplary embodiments set forth herein. Rather, these exemplary embodiments are provided so that this disclosure will be thorough and complete and will fully convey the concept of the inventive concept to those skilled in the art, and the inventive concept will only be defined by the appended claims.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Exemplary embodiments of the invention will hereinafter be described with reference to the accompanying drawings.

Figure 2:
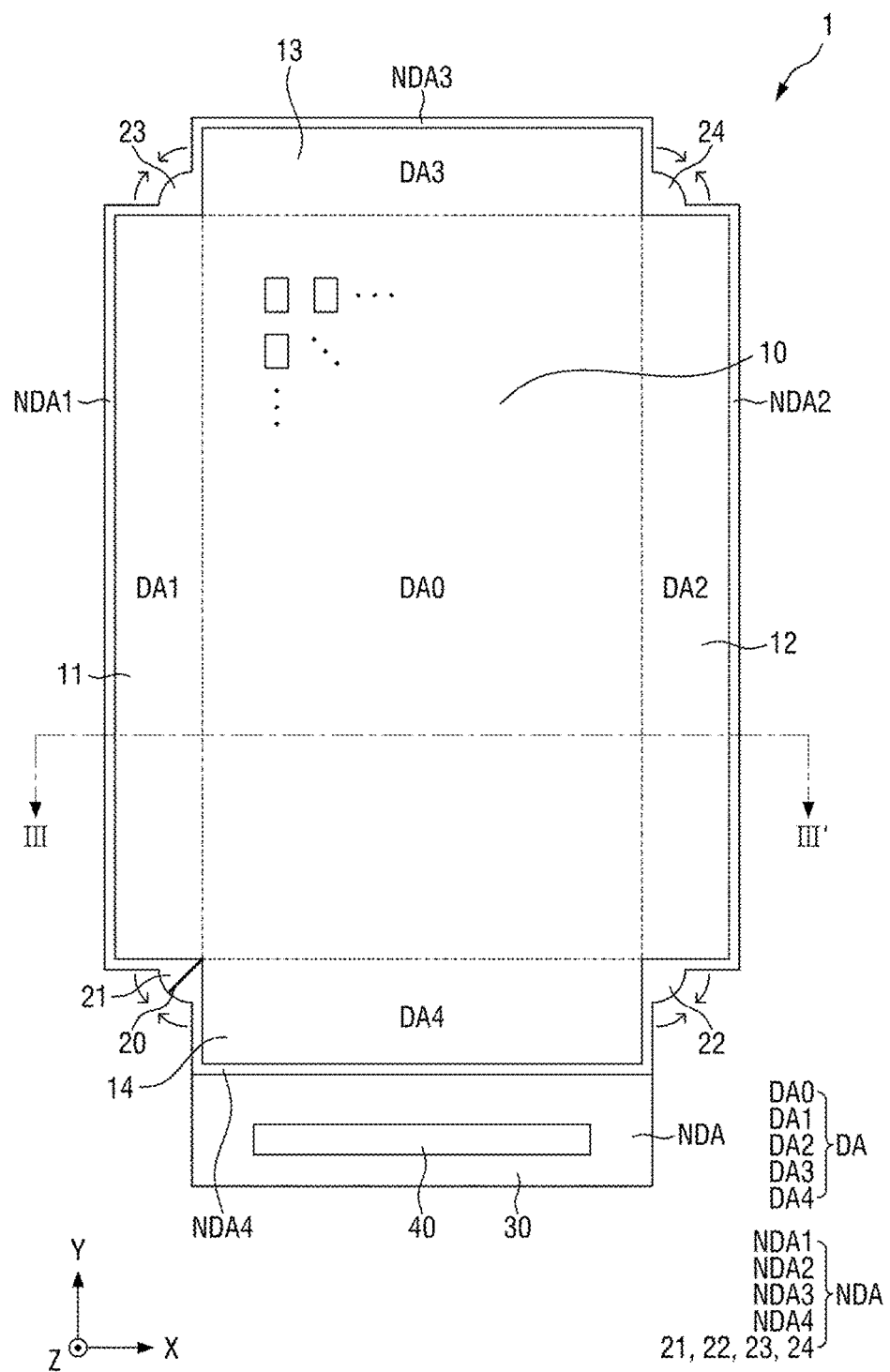
FIG. 2 is a development view of the display device of FIG. 1.

FIG. 1 is a perspective view of a display device according to an exemplary embodiment of the invention. FIG. 2 is a development view of the display device of FIG. 1.

Referring to FIGS. 1 and 2, a display device 1 may display images. For example, the display device 1 may be an organic light-emitting diode (OLED) display, a liquid crystal display (LCD) device, a plasma display panel (PDP) device, a field emission display (FED) device, or an electrophoretic display (EPD) device. The display device 1 will hereinafter be described as being, for example, an OLED device, but the inventive concept is not limited thereto.

The display device 1 may be applied not only to portable electronic devices, such as a mobile phone, a smartphone, a tablet personal computer (PC), a smartwatch, a watch phone, a mobile communication terminal, an electronic notebook, an electronic book (e-book) reader, a portable multimedia player (PMP), a navigation device, or an ultra-mobile PC (UMPC), but also to various other products, such as a television (TV), a notebook computer, a monitor, a billboard, or an Internet-of-things (IoT) device.

The display device 1 may include a main display surface 10 and a plurality of sub-display surfaces (11 through 14).

The main display surface 10 may generally have a plate shape and may be disposed on one plane of the display device 1, and may account for the largest area (or size) among all the display surfaces of the display device 1. For example, the main display surface 10 may be located on the top surface of the display device 1. The main display surface 10 may have various planar shapes, such as a polygonal shape (e.g., a rectangular shape), a circular shape, or an elliptical shape.

The plurality of sub-display surfaces (11 through 14) may be located on different planes from the main display surface 10. Each of the plurality of sub-display surfaces (11 through 14) may have a smaller area than the main display surface 10, and the plurality of sub-display surfaces (11 through 14) may be located on different planes from one another. The plurality of sub-display surfaces (11 through 14) may be connected to the sides of the main display surface 10 and may be bent or folded from the main display surface 10 (or from the sides of the main display surface 10).

For example, in a case where the main display surface 10 has a rectangular shape, the display device 1 may include first through fourth sub-display surfaces 11 through 14, and the first through fourth sub-display surfaces 11 through 14 may be connected to the four sides of the main display surface 10.

The first sub-display surface 11 may be connected to a first long side of the main display surface 10 and may be bent vertically from the main display surface 10 to form a left side surface of the display device 1. Similarly, the second sub-display surface 12 may be connected to a second long side of the main display surface 10 and may be bent vertically from the main display surface 10 to form a right side surface of the display device 1. The third sub-display surface 13 may be connected to a first short side of the main display surface 10 to form an upper side surface of the display surface 10, and the fourth sub-display surface 14 may be connected to a second short side of the main display surface 10 to form a lower side surface of the display surface 10.

In this case, the display device 1 may be a stereoscopic display device capable of displaying images on the top surface and the side surfaces thereof. FIG. 2 illustrates that the bottom surface of the display device 1 does not include a display surface, but the inventive concept is not limited thereto. Alternatively, the display device 1 may include a bottom surface capable of displaying images.

The display device 1 may include a display area DA and a non-display area NDA. The display area DA, which is an area where images are displayed, may include a plurality of pixels PX, which are the smallest units for displaying an image. The non-display area NDA, which is an area where no images are displayed, may not include pixels PX, and will be described later in detail.

The display area DA may include a main display area DA0 and first through fourth sub-display areas DA1 through DA4.

The main display area DA0 may be located on the main display surface 10. For example, the main display surface 10 may include only the main display area DA0. The first sub-display area DA1 may be located on the first sub-display surface 11 and may be connected to the main display area DA0. Similarly, the second through fourth display areas DA2 through DA4 may be located on the second through fourth sub-display surfaces 12 through 14, respectively, and may be connected to the main display area DA0.

In a development view of the display device 1, the non-display area NDA may be disposed along the sides of the display area DA (or along the outermost edges of the display area DA including the main display surface 10 and the first through fourth sub-display surfaces 11 through 14). In the non-display area NDA, driving wires and driving circuits may be disposed. The non-display area NDA may include a decoration ink and a black matrix for preventing leakage light, but the inventive concept is not limited thereto.

The non-display area NDA may include first through fourth non-display areas (or first through fourth sub-non-display areas) NDA1 through NDA4. The first non-display area NDA1 may be located on the first sub-display surface 11. Similarly, the second through fourth non-display areas NDA2 through NDA4 may be located on the second through fourth non-display surfaces 12 through 14, respectively.

The non-display area NDA may include first through fourth corner wings 21 through 24. The first through fourth corner wings 21 through 24 may be disposed adjacent to the corners of the main display surface 10 (where pairs of adjacent sides of the main display surface 10 meet). The first through fourth corner wings 21 through 24 may be substantially the same except for their locations. The characteristics of the first through fourth corner wings 21 through 24 will hereinafter be described, taking the first corner wing 21 as an example.

The first corner wing 21 may protrude outwardly from one of the corners of the main display surface 10. The first corner wing 21 may be disposed between the first and fourth sub-display surfaces 11 and 14 (or between the first and fourth sub-display areas DA1 and DA4) and may alleviate the angle between the first and fourth sub-display surfaces 11 and 14 into an obtuse angle. One end of the first corner wing 21 may be disposed on the first sub-display surface 11, and the other end of the first corner wing 21 may be disposed on the fourth sub-display surface 14.

The first corner wing 21 may provide space for arranging signal wires or which is passed through by signal wires. In a case where the first and fourth sub-display surfaces 11 and 14 are bent, the first corner wing 21 may be folded inwardly (i.e., in a direction toward the inner space of the display device 1 or toward the center of gravity of the display device 1). In this case, the first corner wing 21 may be bent along a bending line 20 so that both ends of the first corner wing 21 that are adjacent to the first and fourth sub-display surfaces 11 and 14) may face each other. Both ends of the first corner wing 21 may be placed in contact with each other or may be coupled together by a coupling layer or the like.

Since the first corner wing 21 is folded inwardly when the first and fourth sub-display surfaces 11 and 14 are bent, the first corner wing 21 may not be exposed, and similarly, the second, third, and fourth corner wings 22, 23, and 24 may also not be exposed. Thus, the first through fourth corner wings 21 through 24 may be included in the non-display area NDA.

The non-display area NDA may further include a driving area 30, and the driving area 30 may be connected to at least one of the first through fourth sub-display surfaces 11 through 14. For example, the driving area 30 may be connected to one side of the fourth sub-display surface 14 (e.g., the lower side of the fourth sub-display surface 14 in a development view of the display device 1).

As illustrated in FIG. 1, when the fourth sub-display surface 14 is bent perpendicularly from the main display surface 10, the driving area 30 may be further bent perpendicularly from the fourth sub-display surface 14 (i.e., by an angle of 180° with respect to the main display surface 10) and may thus be disposed below the main display surface 10 in a thickness direction from the main display surface 10. The driving area 30 may overlap with the main display surface 10 and may be parallel to the main display surface 10.

The display device 1 may include a driver chip 40 (or a pad portion in which the driver chip 40 is disposed and which is electrically connected to the driver chip 40), and the driver chip 40 may be disposed in the driving area 30. The driver chip 40 may generate driving signals for driving the pixels PX and may provide the generated driving signals to the display area DA (or to the pixels PX). For example, the driver chip 40 may generate data signals for determining the emission luminances of the pixels PX and may provide the data signals to the pixels PX via driving wires (not illustrated) formed in the driving area 30 and via data wires (not illustrated) formed in the main display surface 10 and the first through fourth sub-display surfaces 11 through 14.

The display device 1 may further include a touch driving circuit (not illustrated). The touch driving circuit may be connected to touch electrodes of a touch sensing layer TSL. The touch driving circuit applies driving signals to the touch electrodes and measures the static capacitances of the touch electrodes. The driving signals may be signals having multiple driving pulses. The touch driving circuit not only can determine the presence of touch input based on the static capacitances of the touch electrodes, but also can calculate the touch coordinates of the location where the touch input is entered.

Figure 3:
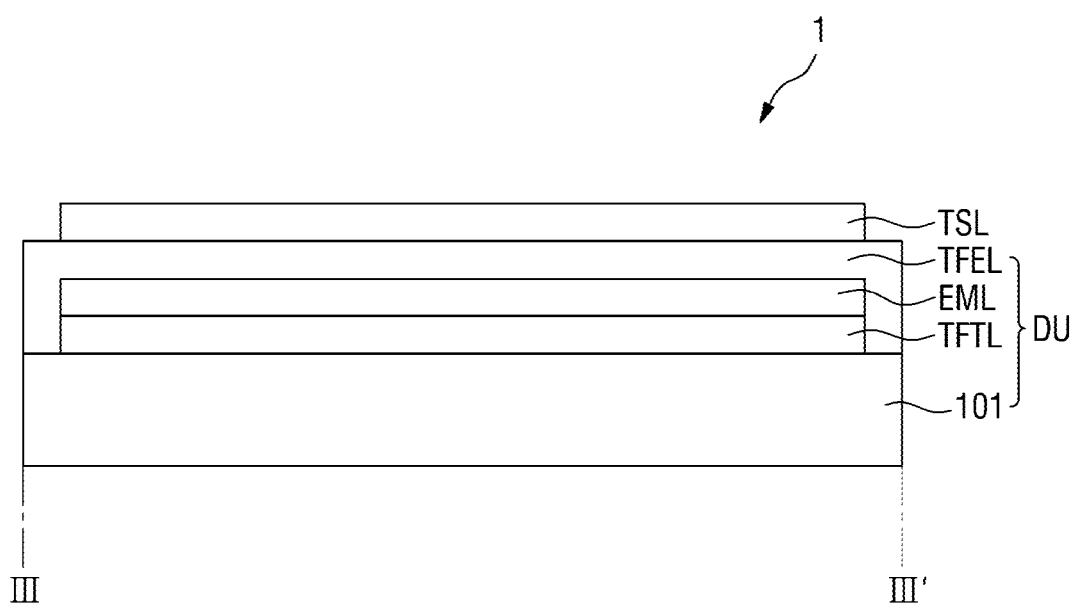
FIG. 3 is a cross-sectional view taken along line of FIG. 2.

FIG. 3 is a cross-sectional view taken along line of FIG. 2.

Referring to FIG. 3, the display device 1 may include a substrate 101, a thin-film transistor (TFT) layer TFTL, a light-emitting element layer EML, a thin-film encapsulation layer TFEL, and the touch sensing layer TSL.

The substrate 101 may be a flexible substrate that is bendable, foldable, or rollable. For example, the flexible substrate may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof.

The TFT layer TFTL may be disposed on the substrate 101. In the TFT layer TFTL, the TFTs of the pixels PX, scan lines, data lines, power lines, scan control lines, and link lines connecting pads and the data lines may be formed. Each of the TFTs of the pixels PX may include a gate electrode, a semiconductor layer, a source electrode, and a drain electrode.

The TFT layer TFTL may be disposed in the display area DA and in the non-display area NDA. Specifically, the TFTs of the pixels PX, the scan lines, the data lines, and the power lines may be disposed in the display area DA, and the scan control lines and the link lines may be disposed in the non-display area NDA.

Figure 10:
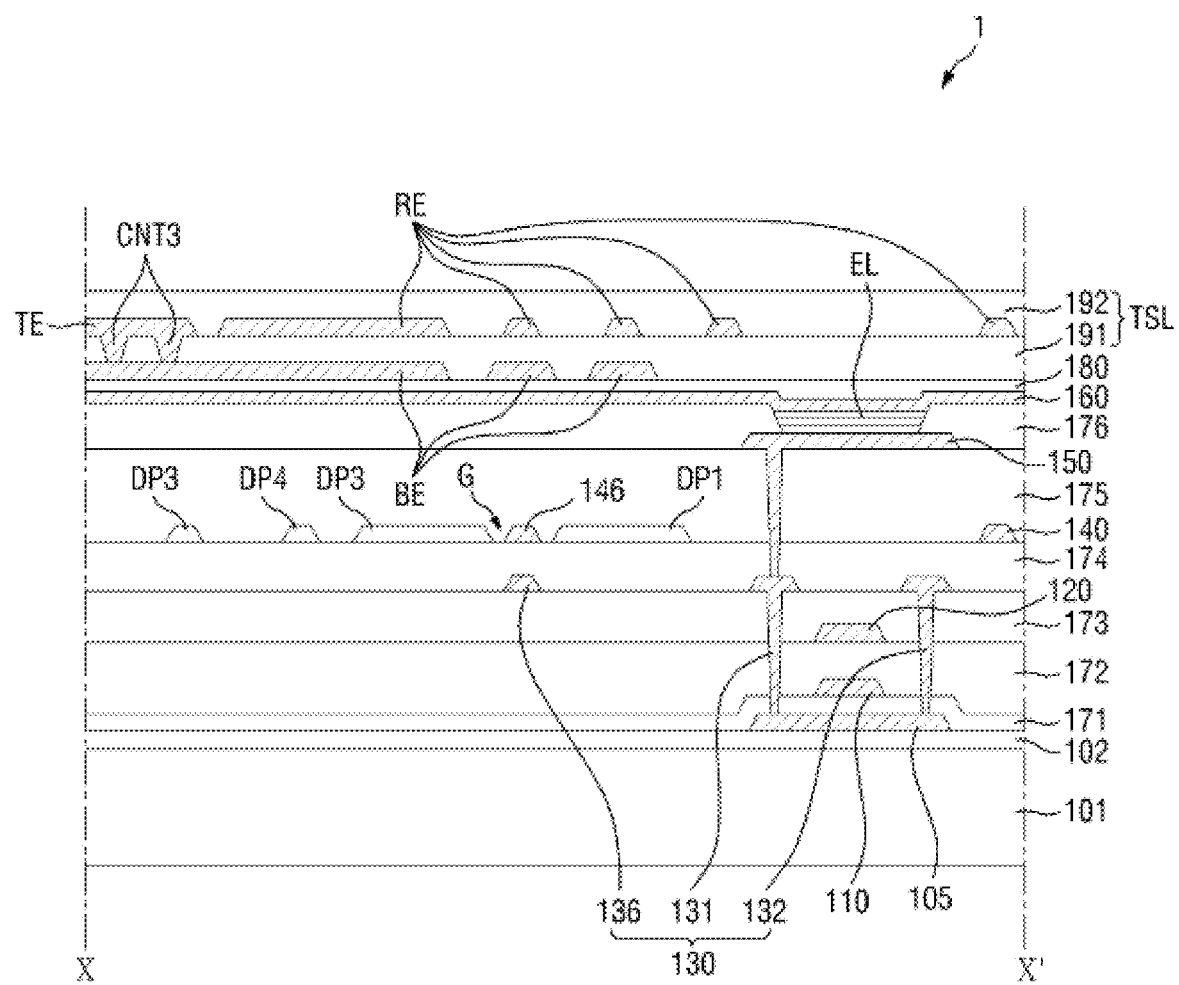
FIG. 10 is a cross-sectional view taken along line X-X' of FIG. 9.

The light-emitting element layer EML may be disposed on the TFT layer TFTL. The light-emitting element layer EML may include the pixels PX, each including a first electrode, an emission layer, and a second electrode, and a pixel-defining layer 176 defining the pixels PX (FIG. 10). The emission layer may be an organic emission layer including an organic material, in which case, the emission layer may include a hole transport layer, an organic light-emitting layer, and an electron transport layer. In response to a predetermined voltage being applied to the first electrode via the TFT layer TFTL and a cathode voltage being applied to the second electrode, holes and electrons may move from the hole transport layer and the electron transport layer to the organic light-emitting layer and may combine together in the organic light-emitting layer to emit light. The pixels PX of the light-emitting element layer EML may be disposed in the display area DA.

The thin-film encapsulation layer TFEL may be disposed on the light-emitting element layer EML. The thin-film encapsulation layer TFEL prevents oxygen or moisture from infiltrating into the light-emitting element layer EML. To this end, the thin-film encapsulation layer TFEL may include at least one inorganic film. The inorganic film may include a silicon nitride layer, a silicon oxynitride layer, a silicon oxide layer, a titanium oxide layer, or an aluminum oxide layer, but the inventive concept is not limited thereto. Also, the thin-film encapsulation layer TFEL protects the light-emitting element layer EML against foreign materials, such as dust. To this end, the thin-film encapsulation layer TFEL may include at least one organic film. The organic film may include an acrylic resin, an epoxy resin, a phenolic resin, a polyamide resin, or a PI resin, but the inventive concept is not limited thereto.

The thin-film encapsulation layer TFEL may be disposed in both the display area DA and the non-display area NDA. Specifically, the thin-film encapsulation layer TFEL may be disposed to cover the light-emitting element layer EML in both the display area DA and the non-display area NDA and to cover the TFT layer TFTL in the non-display area NDA.

The touch sensing layer TSL may be disposed on the thin-film encapsulation layer TFEL. Since the touch sensing layer TSL can be disposed directly on the thin-film encapsulation layer TFEL, the thickness of the display device 1 can be reduced as compared to a case where an additional touch panel including the touch sensing layer TSL is attached to the thin-film encapsulation layer TFEL.

The touch sensing layer TSL may include touch electrodes for detecting touch input from a user in a capacitive manner and touch lines connecting the touch electrodes. For example, the touch sensing layer TSL may detect touch input from the user in a self-capacitance manner or a mutual capacitance manner.

A cover window may be additionally disposed on the touch sensing layer TSL, in which case, the touch sensing layer TSL and the cover window may be attached together by a transparent adhesive member. The touch sensing layer TSL will hereinafter be described.

Figure 4:
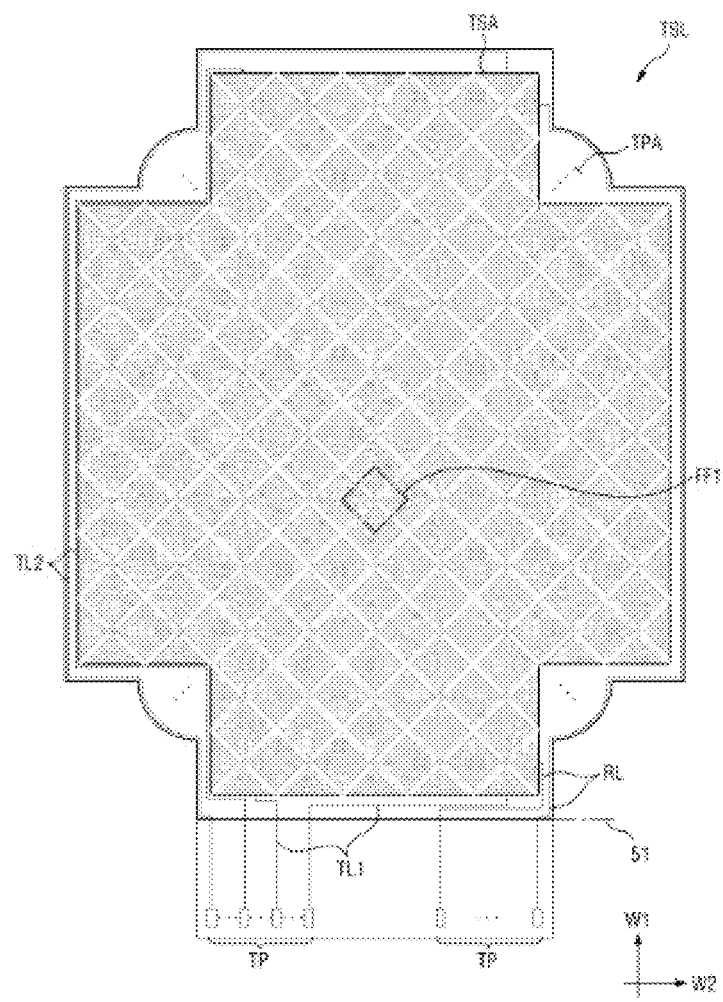
FIG. 4 is a plan view of a touch sensing layer according to an exemplary embodiment of the invention.
Figure 5:
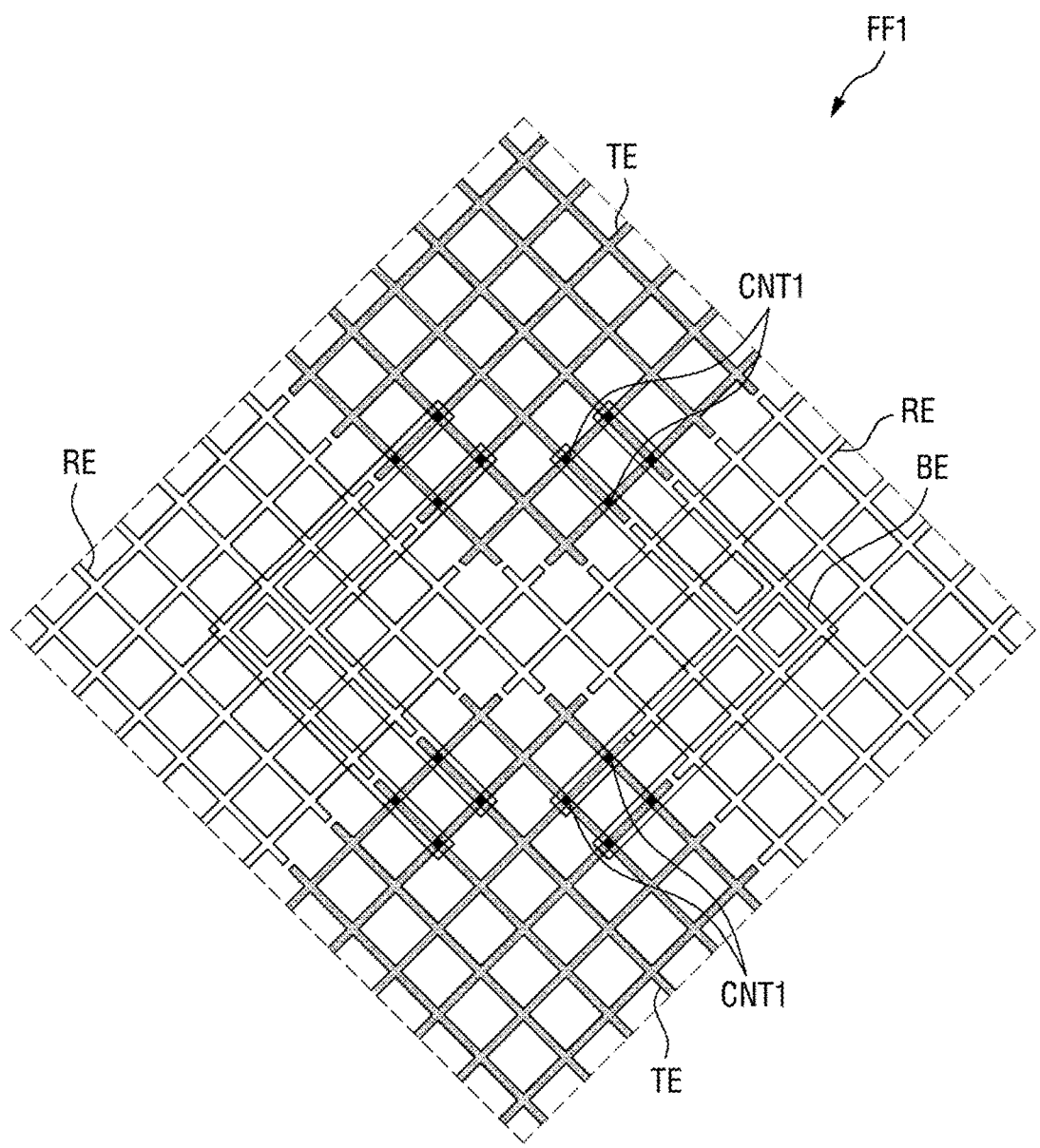
FIG. 5 is an enlarged plan view of an area FF1 of FIG. 4.

FIG. 4 is a plan view of a touch sensing layer according to an exemplary embodiment of the invention. FIG. 5 is an enlarged plan view of an area FF1 of FIG. 4.

Referring to FIGS. 4 and 5, the touch sensing layer TSL includes a touch sensing area TSA, which is for detecting touch input from the user, and a touch peripheral area TPA, which is disposed on the periphery of the touch sensing area TSA.

First touch signal lines TL1, second touch signal lines TL2, third touch signal lines RL, and touch electrode pads TP may be disposed in the touch peripheral area TPA.

First ends of the first touch signal lines TL1 may be connected to first touch electrodes TE disposed in the touch sensing area TSA. Second ends of the first touch signal lines TL1 may be connected to some of the touch electrode pads TP disposed in a touch pad area. That is, the first touch signal lines TL1 connect the first touch electrodes TE disposed in the touch sensing area TSA of the fourth display area DA4 and some of the touch electrode pads TP disposed in the touch pad area.

First ends of the second touch signal lines TL2 may be connected to first touch electrodes TE disposed in the touch sensing area TSA of the third display area DA3. Second ends of the second touch signal lines TL2 may be connected to some of the touch electrode pads TP disposed in the touch pad area via the third non-display area NDA3 and the first non-display area NDA1. That is, the second touch signal lines TL2 connect the first touch electrodes TE disposed in the touch sensing area TSA of the third display area DA3 and some of the touch electrode pads TP disposed in the touch pad area.

First ends of the third touch signal lines RL may be connected to second touch electrodes RE disposed in the touch sensing area TSA of the second display area DA2. Second ends of the third touch signal lines RL may be connected to the other touch electrode pads TP disposed in the touch pad area. That is, the third touch signal lines RL connect the second touch electrodes RE disposed in the touch sensing area TSA of the second display area DA2 and the other touch electrode pads TP disposed in the touch pad area.

The touch electrode pads TP may be disposed on one side of the display device 1. A touch circuit board may be attached on the touch electrode pads TP via an anisotropic conductive film. As a result, the touch electrode pads TP can be electrically connected to the touch circuit board.

The touch sensing area TSA may be disposed in the display area DA and may include the first touch electrodes TE, the second touch electrodes RE, and connecting electrodes BE.

The first touch electrodes TE may be spaced apart from the second touch electrodes RE.

The first touch electrodes TE may be arranged in a plurality of columns along a first direction W1, and the second touch electrodes RE may be arranged in a plurality of rows along a second direction W2. In each of the plurality of columns, the first touch electrodes TE may be electrically connected in the first direction W1. In each of the plurality of rows, the second touch electrodes RE may be electrically connected in the second direction W2.

The first touch electrodes TE and the second touch electrodes RE may be formed to have a diamond shape or a triangular shape in a plan view. Specifically, the first touch electrodes TE and the second touch electrodes RE may have a triangular shape in a plan view near the edges of the touch sensing area TSA, and may have a diamond shape in a plan view in the rest of the touch sensing area TSA.

The first touch electrodes TE and the second touch electrodes RE may be formed as mesh-type electrodes, as illustrated in FIG. 5. In a case where the touch sensing layer TSL including the first touch electrodes TE and the second touch electrodes RE is formed directly on the thin-film encapsulation layer TFEL, very large parasitic capacitances may be generated between the second electrode of the light-emitting element layer EML and the first touch electrodes TE or the second touch electrodes RE of the touch sensing layer TSL because of the second electrode of the light-emitting element layer EML being too close to the first touch electrodes TE or the second touch electrodes RE. Thus, the first touch electrodes TE or the second touch electrodes RE may preferably be formed as mesh-type electrodes, as illustrated in FIG. 5, instead of being formed as non-patterned electrodes of a transparent oxide conductive layer, such as an indium tin oxide (ITO) or an indium zinc oxide (IZO) layer.

The first touch electrodes TE and the second touch electrodes RE may overlap with the pixel-defining layer 176, as shown in FIG. 10. As a result, a decrease in the size of the openings of the pixels PX can be prevented.

The planar shape of the first touch electrodes TE and the second touch electrodes RE in the touch sensing area TSA is not particularly limited.

In order to prevent the first touch electrodes TE and the second touch electrodes RE from being short-circuited at intersections therebetween, pairs of adjacent first touch electrodes TE in the first direction W1 may be electrically connected by the connecting electrodes BE through first contact holes CNT1. In this case, the first touch electrodes TE and the second touch electrode RE may be disposed in the same layer, and the connecting electrodes BE may be disposed in a different layer from the first touch electrodes TE and the second touch electrode RE. Accordingly, first touch electrodes TE electrically connected in the first direction W1 may be electrically insulated from second touch electrodes RE electrically connected in the second direction W2.

For example, the first touch electrodes TE, the second touch electrodes RE, and the connecting electrodes BE may overlap with gaps G between dummy patterns DP and connecting wires 146 or between the dummy patterns DP. That is, the gaps G, which are formed in the display area DA, may be blocked by the first touch electrodes TE, the second touch electrode RE, and the connecting electrodes BE, and as a result, the reflection of external light by the gaps G can be prevented, and smudges caused by the gaps G can be prevented from becoming visible. This will be described later in detail.

Signal wires and connecting wires for transmitting driving signals will hereinafter be described.

Figure 6:
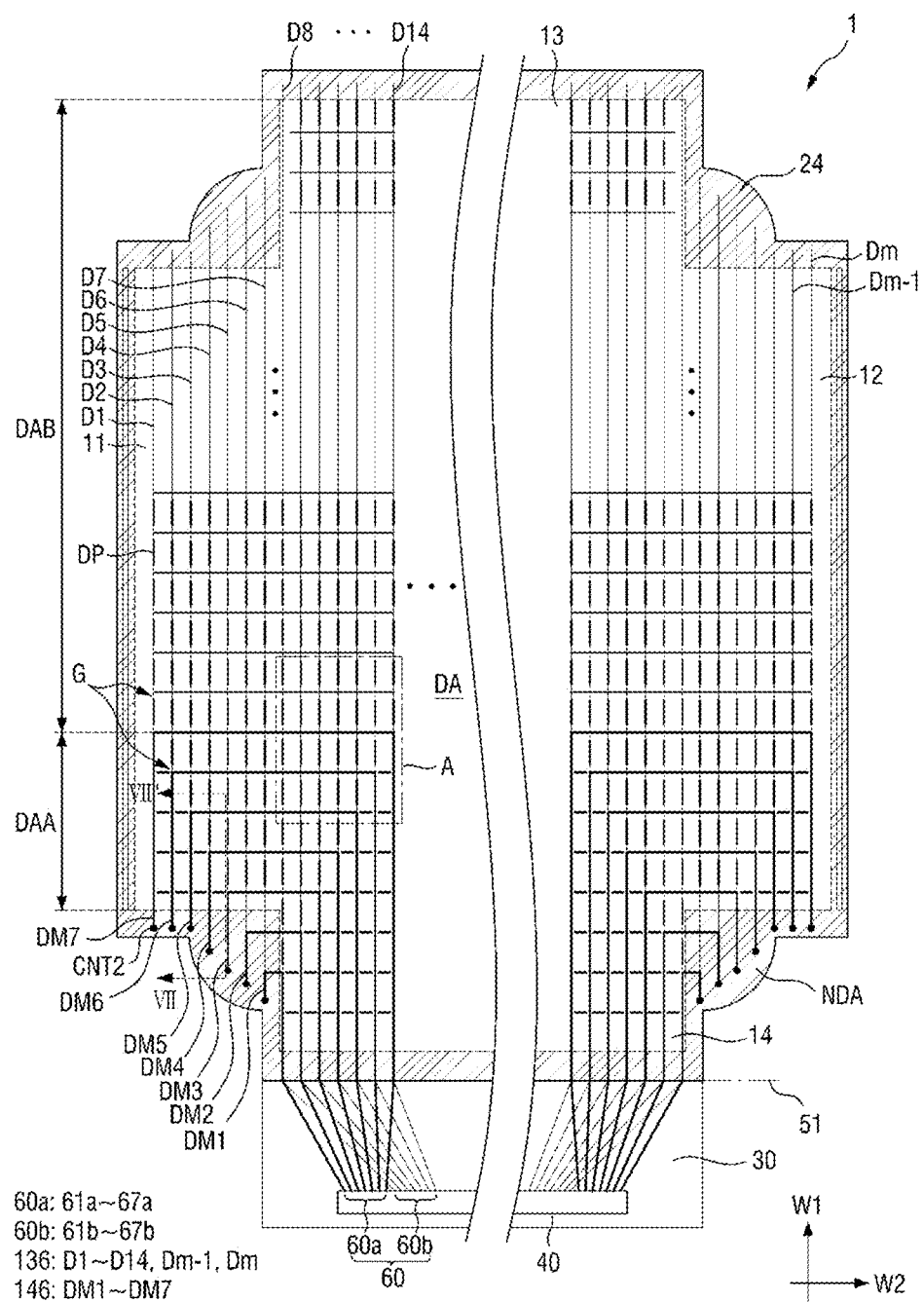
FIG. 6 is a plan view of the display device of FIG. 1.
Figure 7:
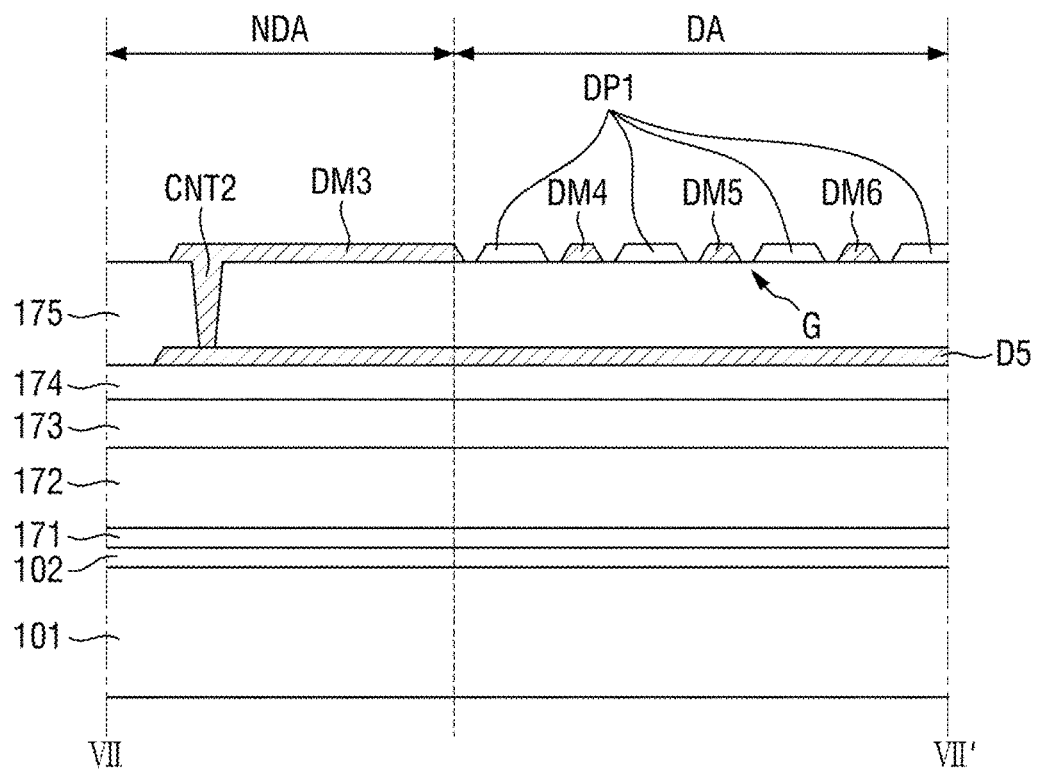
FIG. 7 is a cross-sectional view taken along line VII-VII' of FIG. 6.
Figure 8:
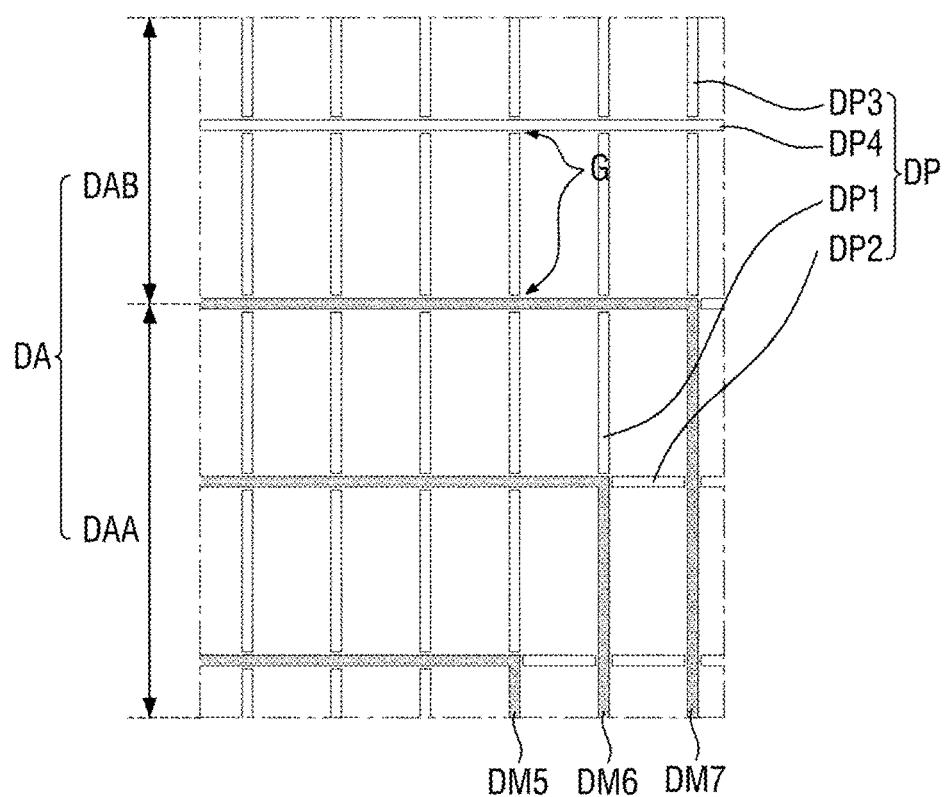
FIG. 8 is an enlarged plan view of an area A of FIG. 6.
Figure 9:
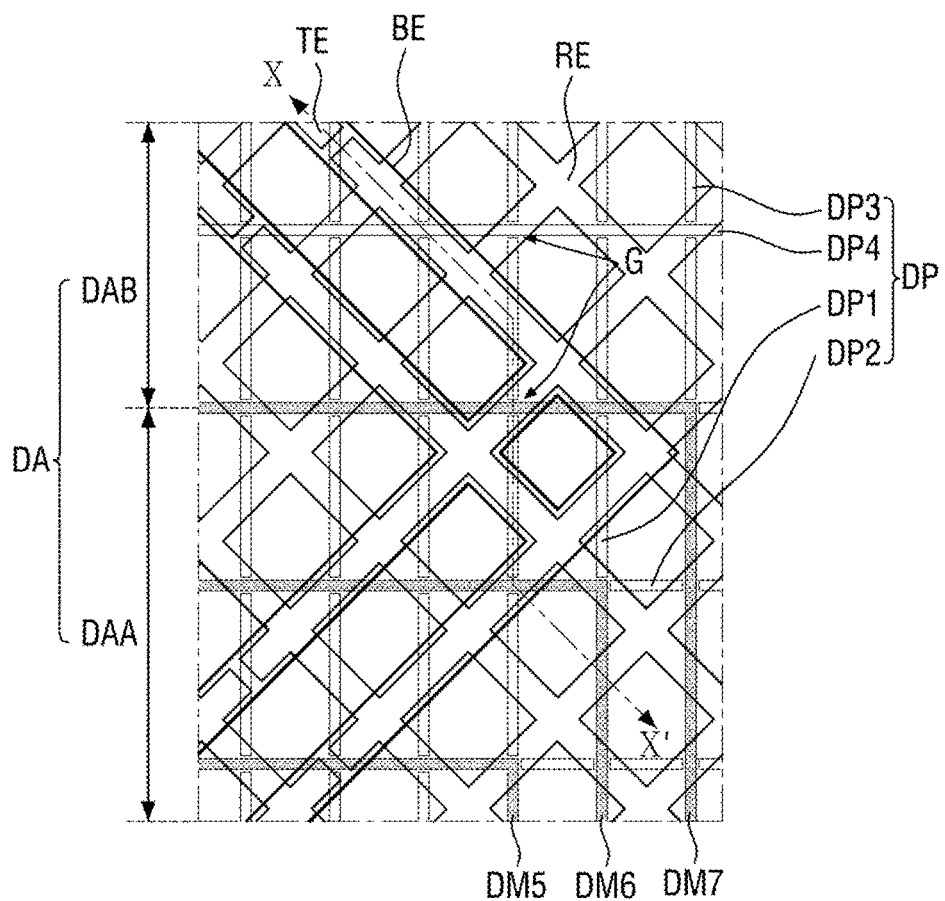
FIG. 9 is a plan view illustrating how a touch sensing layer is arranged over the structure of FIG. 8.

FIG. 6 is a plan view of the display device of FIG. 1. FIG. 7 is a cross-sectional view taken along line VII-VII' of FIG. 6. FIG. 8 is an enlarged plan view of an area A of FIG. 6. FIG. 9 is a plan view illustrating how a touch sensing layer is arranged over the structure of FIG. 8. FIG. 10 is a cross-sectional view taken along line X-X' of FIG. 9.

Referring to FIGS. 6 through 10, the display device 1 may include the data wires 136, the connecting wires 146, driving wires 60, and the dummy patterns DP.

The display area DA of the display device 1 may include first and second areas DAA and DAB. The first area DAA may be an area in which the connecting wires 146 are disposed. The second area DAB may account for the rest of the display area DA.

The data wires 136, the connecting wires 146, the driving wires 60, and the dummy patterns DP may be arranged symmetrically with respect to a reference axis (not illustrated) that extends in the first direction W1 to penetrate the center of the display device 1. The data wires 136, the connecting wires 146, the driving wires 60, and the dummy patterns DP will hereinafter be described, taking, as an example, data wires 136, connecting wires 146, driving wires 60, and dummy patterns DP that are all relatively adjacent to the first sub-display surface 11.

The data wires 136 may include first through m-th data wires (or signal wires) D1 through Dm (where m is an integer of 3 or greater).

The first through m-th data wires D1 through Dm may extend in the first direction W1 and may be sequentially arranged along the second direction W2 to be a predetermined distance apart from one another. The first through m-th data wires D1 through Dm may extend across the display area DA. The first through k-th data wires D1 through Dk (where k is an integer of 2 or greater and is smaller than m) may be disposed in a single display surface together. In the description that follows, it is assumed that k is 7, and that m is greater than 14.

The connecting wires 146 may electrically connect some of the data wires 136 and some of the driving wires 60. The connecting wires 146 may be disposed in a different layer from the data wires 136 and may be insulated from the data wires 136 by an insulating layer, and will be described later with reference to FIG. 8.

The connecting wires 146 may include first through k-th connecting wires DM1 through DMk which correspond to the first through m-th data wires D1 through Dm. When k=7, the connecting wires 146 may include first through seventh connecting wires DM1 through DM7. The first through seventh connecting wires DM1 through DM7 may correspond to the first through seventh data wires D1 through D7, respectively, which are disposed on the first sub-display surface 11.

The first through k-th connecting wires DM1 through DMk may extend from the fourth non-display area NDA4 of the fourth sub-display surface 14 (e.g., from a lower part of the fourth non-display area NDA4) to first ends of the data wires 136 (e.g., to a lower part of the first non-display area NDA1 of the first sub-display surface 11 and the first corner wing 21) via the display area DA. The first through k-th connecting wires DM1 through DMk may be a predetermined distance apart from one another. The distance between the first through k-th connecting wires DM1 through DMk may be the same as the distance between the data wires 136.

The first through k-th connecting wires DM1 through DMk may extend (e.g., in a leftward direction) from the fourth non-display area NDA4 of the fourth sub-display surface 14 (e.g., the lower part of the fourth non-display area NDA4) first in the first direction W1 (e.g., an upward direction) and then in the second direction W2 to reach the first ends of the data wires 136 (i.e., to the lower part of the first non-display area NDA1 of the first sub-display surface 11).

That is, each of the first through k-th connecting wires DM1 through DMk may include a first portion extending from the fourth non-display area NDA4 in the first direction W1, a second portion extending from the end of the first portion in the second direction W2, and a third portion extending from the end of the second portion in the first direction W1 (or in the opposite direction of the first direction W1).

As illustrated in FIG. 6, the first portion of each of the first through k-th connecting wires DM1 through DMk may overlap with one of the data wires 136 in the display area DA. For example, the first portion of the first connecting wire DM1 may overlap with the eighth data wire D8, and the first portion of the seventh connecting wire DM7 may overlap with the fourteenth data wire D14. However, the inventive concept is not limited to this example. In another example, the first portions of the first through k-th connecting wires DM1 through DMk may not overlap with the data wires 136 in the display area DA.

Also, as illustrated in FIG. 6, the third portion of each of the first through k-th connecting wires DM1 through DMk may overlap with one of the data wires 136. For example, the third portion of the first connecting wire DM1 may overlap with the seventh data wire D7, and the third portion of the second connecting wire DM2 may overlap with the sixth data wire D6.

The connecting wires 146 are illustrated as being bent at a right angle, but the inventive concept is not limited thereto.

The connecting wires 146 may not intersect one another, and instead, connecting wires 146 relatively distant from the first corner wing 21 may be disposed to bypass connecting wires 146 relatively adjacent to the first corner wing 21. For example, the first connecting wire DM1 may be disposed to bypass the second connecting wire DM2. That is, as the connecting wires 146 are closer to, for example, the first corner wing 21, the locations at which the connecting wires 146 are bent become closer to the driving area 30, and as the connecting wires 146 are more distant from the first corner wing 21, the locations at which the connecting wires 146 are bent become more distant from the driving area 30.

Since connecting wires 146 relatively distant from the first corner wing 21 are disposed to bypass connecting wires 146 relatively close to the first corner wing 21, the connecting wires 146 may have different lengths. For example, the second connecting wire DM2 may be longer than the first connecting wire DM1. That is, an (i+1)-th connecting wire DMi+1 (where i is a positive integer) may be longer than an i-th connecting wire DMi.

For example, the connecting wires 146 may have the same resistance. For example, if the second connecting wire DM2 is longer than the first connecting wire DM1, the first connecting wire DM1 may have a greater width than the second connecting wire DM2.

The connecting wires 146 may be connected one-on-one directly to the data wires 136 via second contact holes CNT which are formed in the non-display area NDA, particularly, in the lower part of the first non-display area NDA1 and in the second corner wing 22. For example, the first connecting wire DM1 may be electrically connected to the seventh data wire D7, and the seventh connecting wire DM7 may be electrically connected to the first data wire D1. That is, the i-th connecting wire DMi may be electrically connected to the (k+1−i)-th data wire DMk+1−i. For example, as illustrated in FIG. 7, the fifth data wire D5 may be disposed on a fourth insulating layer 174, and the third through sixth connecting wire DM3 through DM6 may be disposed on a fifth insulating layer 175 and may be insulated from the fifth data wire D5 by the fifth insulating layer 175. The third connecting wire DM3 may extend to the first end of the fifth data wire D5 and may be electrically connected to the fifth data wire D5 via a second contact hole CNT2 that exposes the first end of the fifth data wire D5 through the fifth insulating layer 175.

The driving wires 60 include driving wires (or pad wires or pad connecting wires) 61a through 67a and 61b through 67b, and the driving wires 61a through 67a and 61b through 67b may extend from the driver chip 40 (or from the pad portion where the driver chip 40 is disposed) to the fourth non-display area NDA4 of the fourth sub-display surface 14 (or to a tangent 51 between the driving area 30 and the fourth sub-display surface 14).

The driving wires 61a through 67a and 61b through 67b may be divided into first and second driving wire groups 60a and 60b.

The driving wires 61a through 67a, which are included in the first driving wire group 60a, may be disposed in a different layer from the driving wires 61b through 67b, which are included in the second driving wire group 60b, and may intersect the driving wires 61b through 67b in a plan view. The driving wires 61a through 67a may be insulated from the driving wires 61b through 67b by an insulating layer.

The driving wires 61a through 67a may be electrically connected to the first through seventh data wires D1 through D7, respectively, via the first through seventh connecting wires DM1 through DM7, respectively, which are disposed on the first sub-display surface 11. The driving wires 61b through 67b may be electrically connected to the eighth through fourteenth data wires D8 through D14, respectively, via the driving wires 61b through 67b, respectively, which are disposed on the main display surface 10.

As described above, the display device 1 may include the connecting wires 146, which are disposed to pass through the display area DA, and image signals may be provided from the driver chip 40 to the data wires 136 disposed on the first sub-display surface 11 (and on the second sub-display surface 12) via the connecting wires 146. Accordingly, any additional dead space for connecting the data wires 136 disposed on the first sub-display surface 11 (and on the second sub-display surface 12) directly to the driving wires 60 is not needed. As a result, an increase in dead space can be prevented.

Also, since the second contact holes CNT2, which electrically connect the data wires 136 and the connecting wires 146, are formed in the non-display area NDA, the second contact holes CNT2 can be prevented from interfering with the pixels PX (or driving signals provided to the pixels PX). Accordingly, the display quality of the display device 1 can be improved.

The dummy patterns DP will hereinafter be described.

The dummy patterns DP may be disposed in the first and second areas DAA and DAB of the display area DA. The dummy patterns DP may be disposed in the same layer as the connecting wires 146. The dummy patterns DP may include, for example, a metal, an alloy, a metal nitride, a conductive metal oxide, and/or a transparent conductive material, and these materials may be used alone or in combination with one another. For example, the dummy patterns DP may include the same material as the connecting wires 146, and the dummy patterns DP and the connecting wires 146 may be formed at the same time.

For example, the dummy patterns DP may include first dummy patterns DP1 and second dummy patterns DP2, and the first dummy patterns DP1 and the second dummy patterns Dp2 may be disposed in the first area DAA.

The first dummy patterns DP1 may extend in the first direction W1 in a plan view and may be disposed parallel to one another.

The first dummy patterns DP1 may be disposed between the second portions of the first through k-th connecting wires DM1 through DMk. For example, the first dummy patterns DP1 may be disposed between the second portions of the first and second connecting wires DM1 and DM2 and between the second portions of the sixth and seventh connecting wires DM6 and DM7.

As illustrated in FIG. 6, the first dummy patterns DP1 may overlap with the first through m-th data wires D1 through Dm in a plan view. Accordingly, the first dummy patterns DP1 may be aligned with the first through k-th connecting wires DM1 through DMk. For example, first dummy patterns DP1 overlapping with the first data wire D1 may be aligned with the seventh connecting wire DM7, and first dummy patterns DP1 overlapping with the seventh data wire D7 may be aligned with the first connecting wire DM1.

The first dummy patterns DP1 may be disposed parallel to the first portions of the first through k-th connecting wires DM1 through DMk. Also, the first dummy patterns DP1 may be disposed parallel to the third portions of the first through k-th connecting wires DM1 through DMk.

The distance between the first dummy patterns DP1 may be the same as the distance in the second direction W2 between the first through k-th connecting wires DM1 through DMk.

The second dummy patterns DP2 may extend in the second direction W2 in a plan view and may be disposed parallel to one another.

The second dummy patterns DP2 may be disposed between the first portions of the first through k-th connecting wires DM1 through DMk and between the third portions of the first through k-th connecting wires DM1 through DMk. For example, the second dummy patterns DP2 may be disposed between the first portions of the first and second connecting wires DM1 and DM2 and between the first portions of the sixth and seventh connecting wires DM6 and DM7. Also, the second dummy patterns DP2 may be disposed between the third portions of the first and second connecting wires DM1 and DM2 and between the third portions of the sixth and seventh connecting wires DM6 and DM7.

The second dummy patterns DP2 may be disposed parallel to the second portions of the first through k-th connecting wires DM1 through DMk. Also, the second dummy patterns DP2 may be aligned with the second portions of the first through k-th connecting wires DM1 through DMk.

The distance between the second dummy patterns DP2 may be the same as the distance in the first direction W1 between the first through k-th connecting wires DM1 through DMk.

For example, the first dummy patterns DP1 may have a smaller average length than the second dummy patterns DP2.

For example, the dummy patterns DP may further include third dummy patterns DP3 and fourth dummy patterns DP4, and the third dummy patterns DP3 and the fourth dummy patterns DP4 may be disposed in the second area DAB.

The third dummy patterns DP3 may extend in the first direction W1 in a plan view and may be disposed parallel to one another. A plurality of third dummy patterns DP3 may be disposed between the fourth dummy patterns DP4 as island patterns.

As illustrated in FIG. 6, the third dummy patterns DP3 may overlap with the first through m-th data wires D1 through Dm in a plan view. Accordingly, the third dummy patterns DP3 may be aligned with the first through k-th connecting wires DM1 through DMk and/or with the first dummy patterns DP1. For example, third dummy patterns DP3 overlapping with the first data wire D1 may be aligned with the seventh connecting wire DM7, and third dummy patterns DP3 overlapping with the seventh data wire D7 may be aligned with the first connecting wire DM1. Also, third dummy patterns DP3 overlapping with the first data wire D1 may be aligned with the first dummy patterns DP1 overlapping with the first data wire D1.

The third dummy patterns DP3 may be disposed parallel to the first portions of the first through k-th connecting wires DM1 through DMk. Also, the third dummy patterns DP3 may be disposed parallel to the third portions of the first through k-th connecting wires DM1 through DMk. Also, the third dummy patterns DP3 may be disposed parallel to the first dummy patterns DP1.

The distance between the third dummy patterns DP3 may be the same as the distance in the second direction W2 between the first through k-th connecting wires DM1 through DMk. Also, the distance between the third dummy patterns DP3 may be the same as the distance in the second direction W2 between the first dummy patterns DP1.

The length, in the first direction W1, of the third dummy patterns DP3 may be the same as the length, in the first direction W1, of the first dummy patterns DP1.

The fourth dummy patterns DP4 may extend in the second direction W2 in a plan view and may be disposed parallel to one another.

The fourth dummy patterns DP4 may be disposed parallel to the second portions of the first through k-th connecting wires DM1 through DMk. Also, the fourth dummy patterns DP4 may be disposed parallel to the second dummy patterns DP2.

The distance between the fourth dummy patterns DP4 may be the same as the distance in the first direction W1 between the first through k-th connecting wires DM1 through DMk. Also, the distance between the fourth dummy patterns DP4 may be the same as the distance in the first direction W1 between the second dummy patterns DP2.

For example, the third dummy patterns DP3 may have a smaller average length than the fourth dummy patterns DP4.

As described above, since the dummy patterns DP include the first dummy patterns DP1, the second dummy patterns DP2, the third dummy patterns DP3, and the fourth dummy patterns DP4, the dummy patterns DP can form a lattice pattern shape in and across the display area DA together with the connecting wires 146. Accordingly, any differences in the shape of patterns between the first and second areas DAA and DAB can be minimized, and as a result, the connecting wires 146 can be prevented from becoming visible.

For example, the dummy patterns DP may not overlap with the first through k-th connecting wires DM1 through DMk in a plan view. Accordingly, gaps G may be formed between the dummy patterns DP and the first through k-th connecting wires DM1 through DMk. For example, as illustrated in FIGS. 7 and 8, gaps G may be formed between the first dummy patterns DP1 and the second portions of the first through k-th connecting wires DM1 through DMk. Also, gaps G may be formed between the second dummy patterns DP2 and the first portions (and/or the third portions) of the first through k-th connecting wires DM1 through DMk. Also, gaps G may be formed between the third dummy patterns DP3 and the second portions of the first through k-th connecting wires DM1 through DMk. Also, gaps G may be formed between the fourth dummy patterns DP4 and the second portions of the first through k-th connecting wires DM1 through DMk.

The dummy patterns DP may not overlap with one another. Accordingly, gaps G may be formed between the dummy patterns DP. For example, the third dummy patterns DP3 may not overlap with the fourth dummy patterns DP4 in a plan view, and gaps G may be formed between the third dummy patterns DP3 and the fourth dummy patterns DP4.

For example, as illustrated in FIG. 9, the gaps G formed in the display device 1 may overlap with the first touch electrodes TE, the second touch electrodes RE, and the connecting electrodes BE. That is, the first touch electrodes TE, the second touch electrodes RE, and the connecting electrodes BE may block the gaps G formed in the display area DA. Accordingly, the reflection of external light by the gaps G can be prevented, and smudges caused by the gaps G can be prevented from becoming visible. As a result, the display quality of the display device 1 can be further improved.

The arrangement of the first touch electrodes TE, the second touch electrodes RE, and the connecting electrodes BE to overlap with the gaps G, however, is not particularly limited, and may vary.

The cross-sectional structure of the display device 1 will hereinafter be described.

FIG. 10 is a cross-sectional view taken along line X-X' of FIG. 9.

Referring to FIG. 10, the display device 1 may include the substrate 101, a buffer layer 102, a semiconductor layer 105, a first insulating layer 171, a first gate conductive layer 110, a second insulating layer 172, a second gate conductive layer 120, a third insulating layer 173, a first source/drain conductive layer 130, the fourth insulating layer 174, a second source/drain conductive layer 140, the fifth insulating layer 175, a first electrode layer 150, a light-emitting element layer EML (FIG. 3), and a second electrode layer 160. The TFTs of the pixels PX may be formed in the semiconductor layer 105, the first insulating layer 171, the first gate conductive layer 110, the second insulating layer 172, and thus, the second gate conductive layer 120, and the semiconductor layer 105, the first insulating layer 171, the first gate conductive layer 110, the second insulating layer 172, and the second gate conductive layer 120 may be collectively referred to as a "driving element layer".

The substrate 101 may support the layers disposed thereon. The substrate 101 may be formed of an insulating material. The substrate 101 may be formed of an inorganic material such as glass or quartz or may be formed of an organic material, such as a PI resin. The substrate 101 may be a rigid substrate or a flexible substrate.

The buffer layer 102 may be disposed on the substrate 101. The buffer layer 102 may prevent the diffusion of impurity ions and the infiltration of moisture or external air and may perform a surface planarization function. The buffer layer 102 may include silicon nitride, silicon oxide, or silicon oxynitride. The buffer layer 102 may not be provided depending on the type of the substrate 101 and how the substrate 101 is fabricated.

The semiconductor layer 105 may be disposed on the buffer layer 102. The semiconductor layer 105 may form the channels of the TFTs of the pixels PX. The semiconductor layer 105 may include polycrystalline silicon. Portions of the semiconductor layer 105 (e.g., source/drain regions) that are connected to the source/drain electrodes of the TFTs of the pixels PX may be doped with impurity ions (e.g., p-type impurity ions). A trivalent dopant, such as boron (B), may be used as the source of the p-type impurity ions. The semiconductor layer 105 may include, instead of polycrystalline silicon, monocrystalline silicon, low-temperature polycrystalline silicon, amorphous silicon, or an oxide semiconductor, such as indium tin zinc oxide (ITZO) or indium gallium zinc oxide (IGZO).

The first insulating layer 171 may be disposed on the semiconductor layer 171. The first insulating layer 171 may be a gate insulating layer having a gate insulating function.

The first gate conductive layer 110 may be disposed on the first insulating layer 171. The first gate conductive layer 110 may include the gate electrodes of transistors. The first gate conductive layer 110 may include the first electrodes of storage capacitors Cst.

The first gate conductive layer 110 may include at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The second insulating layer 172 may be disposed on the first gate conductive layer 110. The second insulating layer 172 may be an interlayer insulating layer.

The second gate conductive layer 120 may be disposed on the second insulating layer 172. The second gate conductive layer 120 may include the second electrodes of the storage capacitors Cst. The second gate conductive layer 120 may be disposed to overlap with the first gate conductive layer 110 with the second insulating layer 172 interposed therebetween and thus to form the storage capacitors Cst. The second gate conductive layer 120 may include the same material as the first gate conductive layer 110.

The third insulating layer 173 may be disposed on the second gate conductive layer 120.

The first source/drain conductive layer 130 may be disposed on the third insulating layer 173. The first source/drain conductive layer 130 may include source electrodes 132 and drain electrodes 131, and the data wires 136 (of FIG. 6). The source electrodes 132 and drain electrodes 131 may be electrically connected to the semiconductor layer 105 through contact holes that penetrate the second and third insulating layers 172 and 173 to expose the semiconductor layer 105.

The first source/drain conductive layer 130 may include at least one metal selected from among Mo, Al, Pt, Pd, Ag, Mg, Au, Ni, Nd, Ir, Cr, Ca, Ti, Ta, W, and Cu. The first source/drain conductive layer 130 may be a single-layer film or a multilayer film. For example, the first source/drain conductive layer 130 may be formed to have a stacked structure of Ti/Al/Ti, Mo/Al/Mo, Mo/AlGe/Mo, or Ti/Cu.

The fourth insulating layer 174 may be disposed on the first source/drain conductive layer 130, and the second source/drain conductive layer 140 may be disposed on the fourth insulating layer 174.

The second source/drain conductive layer 140 may include the connecting wires 146 (i.e., the first through k-th connecting wires DM1 through DMk). The connecting wires 146 may be disposed to overlap with the data wires 136 (i.e., the first through m-th data wires D1 through Dm) in a cross-sectional view.

The second source/drain conductive layer 140 may include the dummy patterns DP. Gaps G may be formed between the dummy patterns DP or between the dummy patterns DP and the connecting wires 146.

The second source/drain conductive layer 140 may include the same metal(s) as the first source/drain conductive layer 130.

The fifth insulating layer 175 may be disposed on the second source/drain conductive layer 140, and the first electrode layer 150 may be disposed on the fifth insulating layer 175. The first electrode layer 150 may include anode electrodes 151 of OLEDs, and the anode electrodes 151 may be electrically connected to the drain electrodes 131 of the first transistors through contact holes that penetrate the fifth and fourth insulating layers 175 and 174.

The light-emitting element layer EML may be disposed on the first electrode layer 150 and may include the pixel-defining layer 176 and an organic layer EL. The pixel-defining layer 176 may be disposed on the anode electrodes 151 and along the edges of each of the anode electrodes 151 and may include openings which expose the first electrode layer 150.

The organic layer EL may be disposed in the openings of the pixel-defining layer 176. The organic layer EL may include an organic light-emitting layer, a hole injection/transport layer, and an electron injection/transport layer. The second electrode layer 160 (or the cathode electrodes of the OLEDs) may be disposed on the organic layer EL and on the pixel-defining layer 176. The second electrode layer 160 may be a common electrode disposed in the entire display area DA of the display device 1.

A passivation layer 180 may be disposed on the second electrode layer 160. The passivation layer 180 may prevent moisture or oxygen from infiltrating into the light-emitting element layer EML. The passivation layer 180 may include at least one inorganic film and/or at least one organic film. The inorganic film may include at least one inorganic material selected from among, for example, $Al_xO_y$, $TiO_x$, $ZrO_x$, $SiO_x$, $AlO_xN_y$, $Al_xN_y$, $SiO_xN_y$, $Si_xN_y$, $ZnO_x$, and $Ta_xO_y$. The organic film may be formed by polymerizing at least one monomer selected from the group consisting of pentabromophenyl acrylate, 2-(9H-carbazol-9-yl)ethyl methacrylate, N-vinylcarbazole, bis(methacryloylthiophenyl)sulfide, and zirconium acrylate. The organic film may be a planarization film.

The touch sensing layer TSL may be disposed on the passivation layer 180.

The touch sensing layer TSL may include a first touch conductive layer, a first touch insulating layer 191, a second touch conductive layer, and a second touch insulating layer 192. The touch sensing layer TSL may further include a buffer layer (not illustrated) which is disposed below the first touch conductive layer for forming the first touch conductive layer, the first touch insulating layer 191, the second touch conductive layer, and the second touch insulating layer 192, but the inventive concept is not limited thereto.

Each of the first and second touch conductive layers may have a single-layer structure or a multilayer structure consisting of two or more layers. When formed to have a single-layer structure, each of the first and second touch conductive layers may include a metal layer or a transparent conductive layer. The metal layer may include Mo, Ag, Ti, Cu, Al, or an alloy thereof. The transparent conductive layer may include a transparent conductive oxide such as ITO, IZO, zinc oxide (ZnO), or ITZO. The transparent conductive layer may also include a conductive polymer such as PEDOT, metal nanowire, or graphene. When formed to have a multilayer structure, each of the first and second touch conductive layers may include multiple metal layers. The multiple metal layers may have a triple-layer structure of Ti/Al/Ti. When formed to have a multilayer structure, each of the first and second touch conductive layers may include at least one metal layer and at least one transparent conductive layer.

The first and second touch conductive layers may have a mesh shape. In this case, the first and second touch conductive layers may not be visible to the user.

The first touch conductive layer may include the connecting electrodes BE. The second touch conductive layer may include the first touch electrodes TE and the second touch electrodes RE. The first touch electrodes TE may be connected to the connecting electrodes BE through third contact holes CNT3 which penetrate the first touch insulating layer 191. Accordingly, the first touch electrodes TE and the second touch electrodes RE can be prevented from being short-circuited at the intersections therebetween.

In order to prevent the aperture ratio of the pixels PX from decreasing, the first touch electrodes TE, the second touch electrodes RE, and the connecting electrodes BE may be disposed to overlap with the pixel-defining layer 176.

Each of the first and second touch insulating layers 191 and 192 may have a single-layer structure or a multilayer structure. Each of the first and second touch insulating layers 191 and 192 may include an inorganic material, an organic material, or a combination thereof.

Each of the first and second touch insulating layers 191 and 192 may include an organic film and/or an inorganic film. The inorganic film may include at least one of aluminum oxide, titanium oxide, silicon oxide, silicon oxynitride, zirconium oxide, and hafnium oxide. The organic film may include at least one of an acrylic resin, a methacrylic resin, polyisoprene, a vinyl resin, an epoxy resin, a urethane resin, a cellulose resin, a siloxane resin, a PI resin, a PA resin, and a perylene resin.

A display device according to another exemplary embodiment of the invention will hereinafter be described. Like reference numerals indicate like elements throughout the present disclosure, and thus, descriptions thereof will be omitted or at least simplified.

Figure 11:
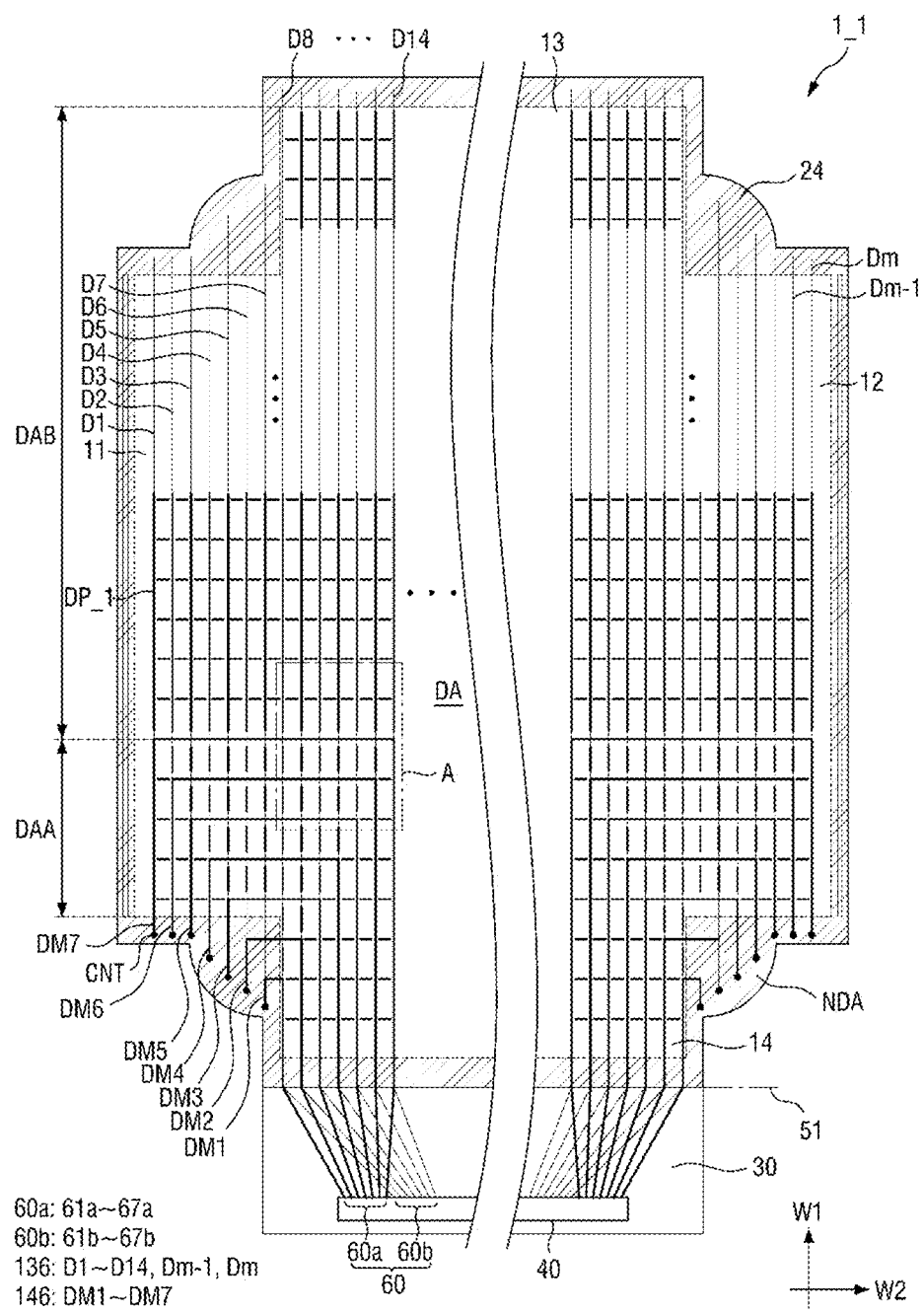
FIG. 11 is a plan view of a display device according to another exemplary embodiment of the invention.
Figure 12:
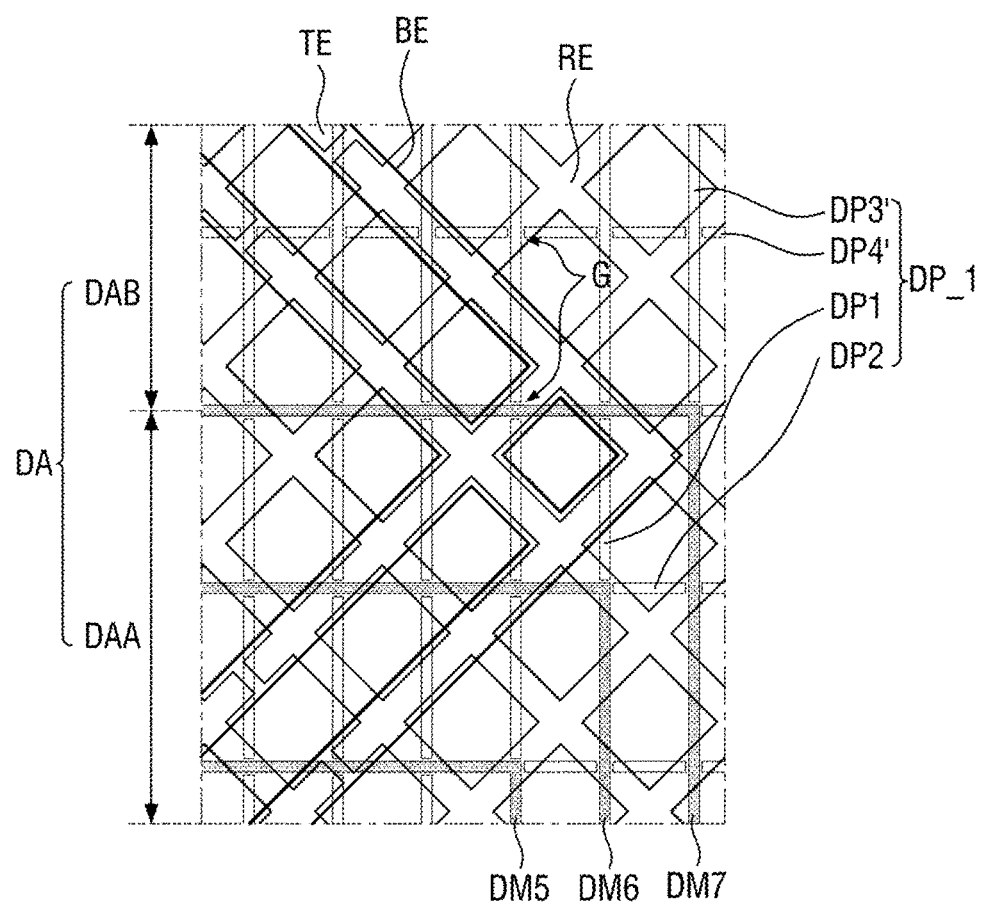
FIG. 12 is an enlarged plan view of an area A of FIG. 11.

FIG. 11 is a plan view of a display device according to another exemplary embodiment of the invention. FIG. 12 is an enlarged plan view of an area A of FIG. 11.

Referring to FIGS. 11 and 12, a display device 1_1 differs from the display device 1 of FIGS. 6 through 10 in the pattern of arrangement of dummy patterns DP_1.

Specifically, the dummy patterns DP_1 may include third dummy patterns DP3' and fourth dummy patterns DP4', and the third dummy patterns DP3' and the fourth dummy patterns DP4' may be disposed in a second area DAB of a display area DA.

The third dummy patterns DP3' may extend in a first direction W1 in a plan view and may be disposed parallel to one another.

The fourth dummy patterns DP4' may extend in a second direction W2 in a plan view and may be disposed parallel to one another. A plurality of fourth dummy patterns DP4' may be disposed between the third dummy patterns DP3' as island patterns.

For example, the third dummy patterns DP3' may have a greater average length than the fourth dummy patterns DP4'.

For example, the dummy patterns DP_1 may not overlap with first through k-th connecting wires DM1 through DMk in a plan view. Accordingly, gaps G may be formed between the dummy patterns DP_1 and the first through k-th connecting wires DM1 through DMk.

The dummy patterns DP_1 may not overlap with one another. Accordingly, gaps G may also be formed between the dummy patterns DP_1.

For example, as illustrated in FIG. 12, the gaps G formed in the display device 1_1 may overlap with first touch electrodes TE, second touch electrodes RE, and connecting electrodes BE of a touch sensing layer TSL.

As described above, since the dummy patterns DP_1 include first dummy patterns DP1, second dummy patterns DP2, the third dummy patterns DP3', and the fourth dummy patterns DP4', the dummy patterns DP_1 can form a lattice pattern shape in the display area DA together with connecting wires 146. Also, as described above, since the first touch electrodes TE, the second touch electrodes RE, and the connecting electrodes BE block the gaps G formed in the display area DA, the reflection of external light by the gaps G can be prevented, and smudges caused by the gaps G can be prevented from becoming visible.

A display device according to another exemplary embodiment of the invention will hereinafter be described.

Figure 13:
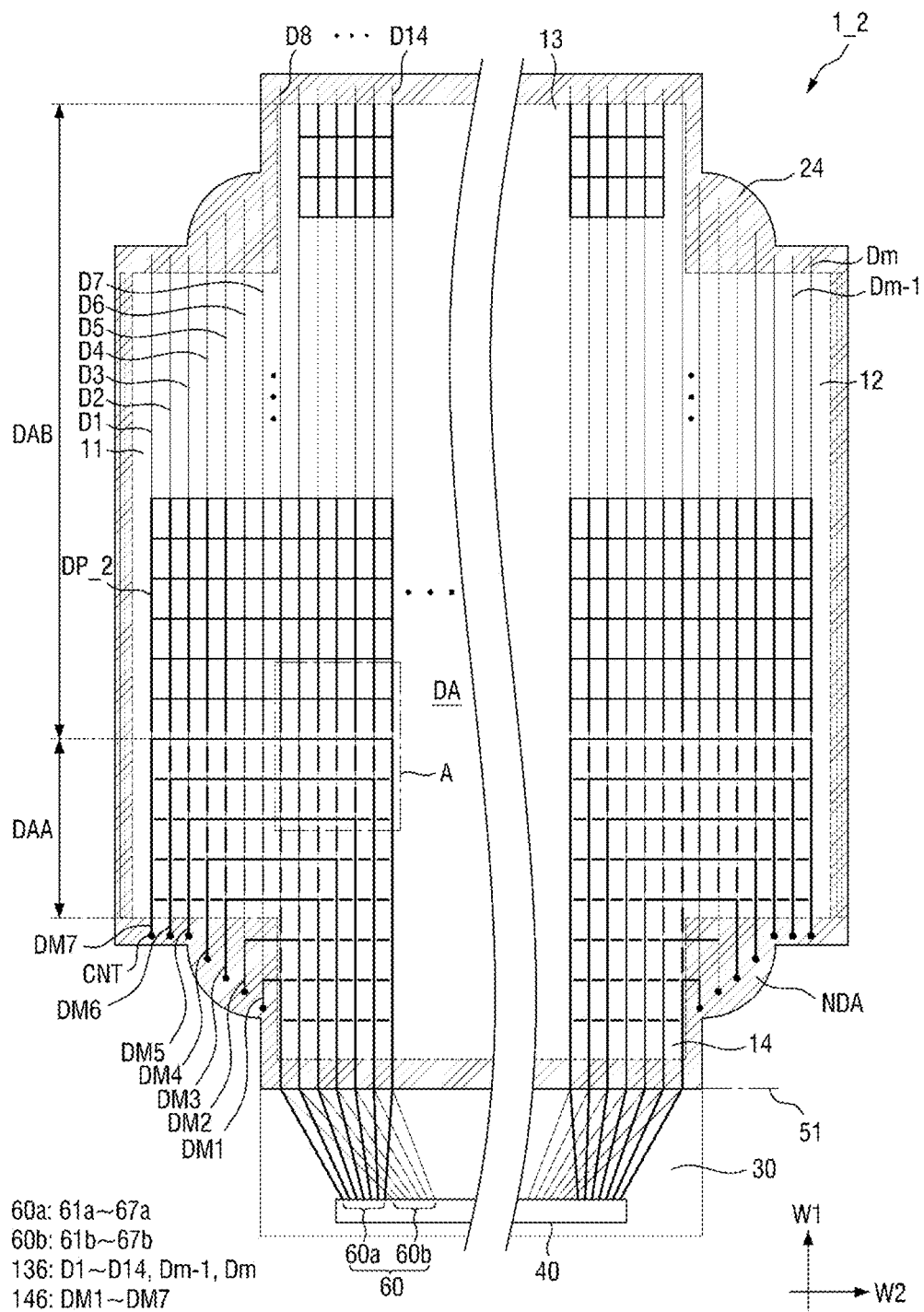
FIG. 13 is a plan view of a display device according to another exemplary embodiment of the invention.
Figure 14:
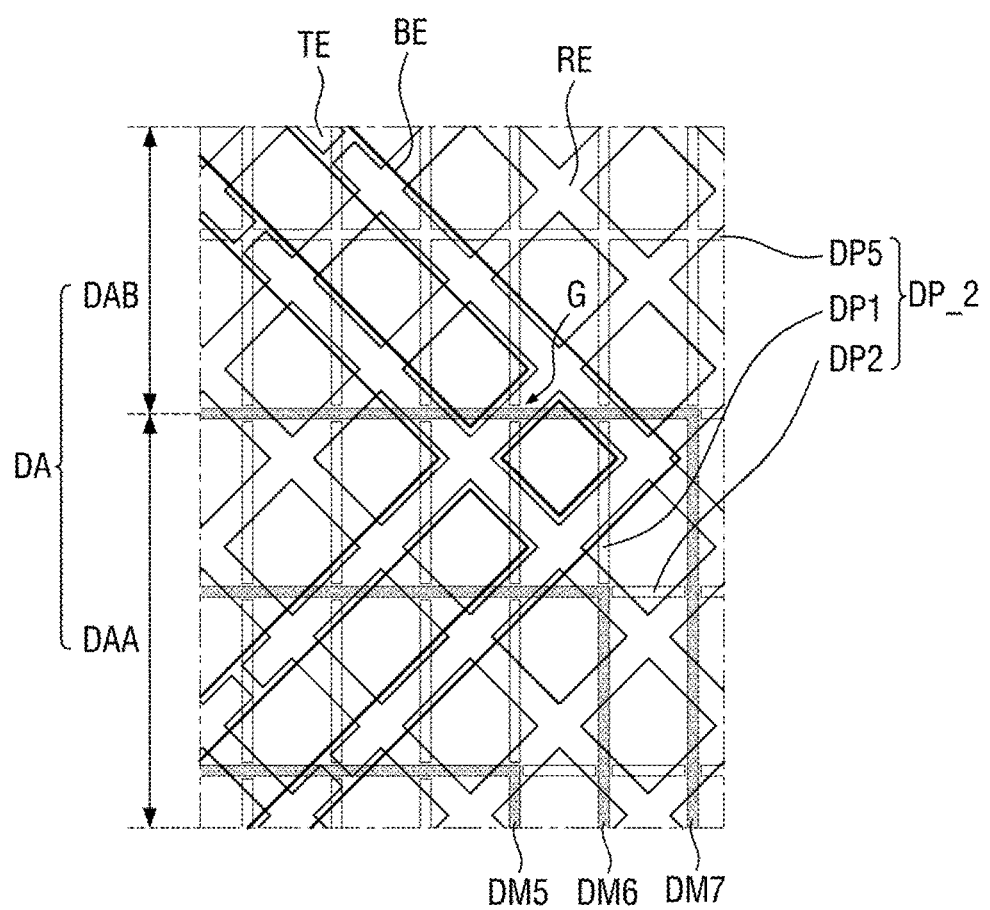
FIG. 14 is an enlarged plan view of an area A of FIG. 13.

FIG. 13 is a plan view of a display device according to another exemplary embodiment of the invention. FIG. 14 is an enlarged plan view of an area A of FIG. 13.

Referring to FIGS. 13 and 14, a display device 1_2 differs from the display device 1 of FIGS. 6 through 10 in the pattern of arrangement of dummy patterns DP_2.

Specifically, the dummy patterns DP_2 may include fifth dummy patterns DP5 which are disposed in a second area DAB of a display area DA.

The fifth dummy patterns DP5 may be arranged in a lattice pattern form in and across the second area DAB. That is, the fifth dummy patterns DP5 may include a plurality of column patterns which extend in a first direction W1 and a plurality of row patterns which extend in a second direction W2. The column patterns may be disposed to intersect, and overlap with, the row patterns. No gaps may be formed in the second area DAB where the fifth dummy patterns DP5 are disposed. Gaps G may be formed only at the interface between a first area DAA and the second area DAB between the fifth dummy patterns DP5 and first through k-th connecting wires DM1 through DMk.

As illustrated in FIG. 14, the gaps G formed in the display area DA may overlap with first touch electrodes TE, second touch electrodes RE, and connecting electrodes BE of a touch sensing layer TSL.

As described above, since the dummy patterns DP_2 include the fifth dummy patterns DP5, which are formed as lattice patterns, the fifth dummy patterns DP5 may form a lattice pattern shape in the display area DA together with connecting wires 146. Also, as described above, since the first touch electrodes TE, the second touch electrodes RE, and the connecting electrodes BE block the gaps G formed in the display area DA, the reflection of external light by the gaps G can be prevented, and smudges caused by the gaps G can be prevented from becoming visible.

A display device according to another exemplary embodiment of the invention will hereinafter be described.

Figure 15:
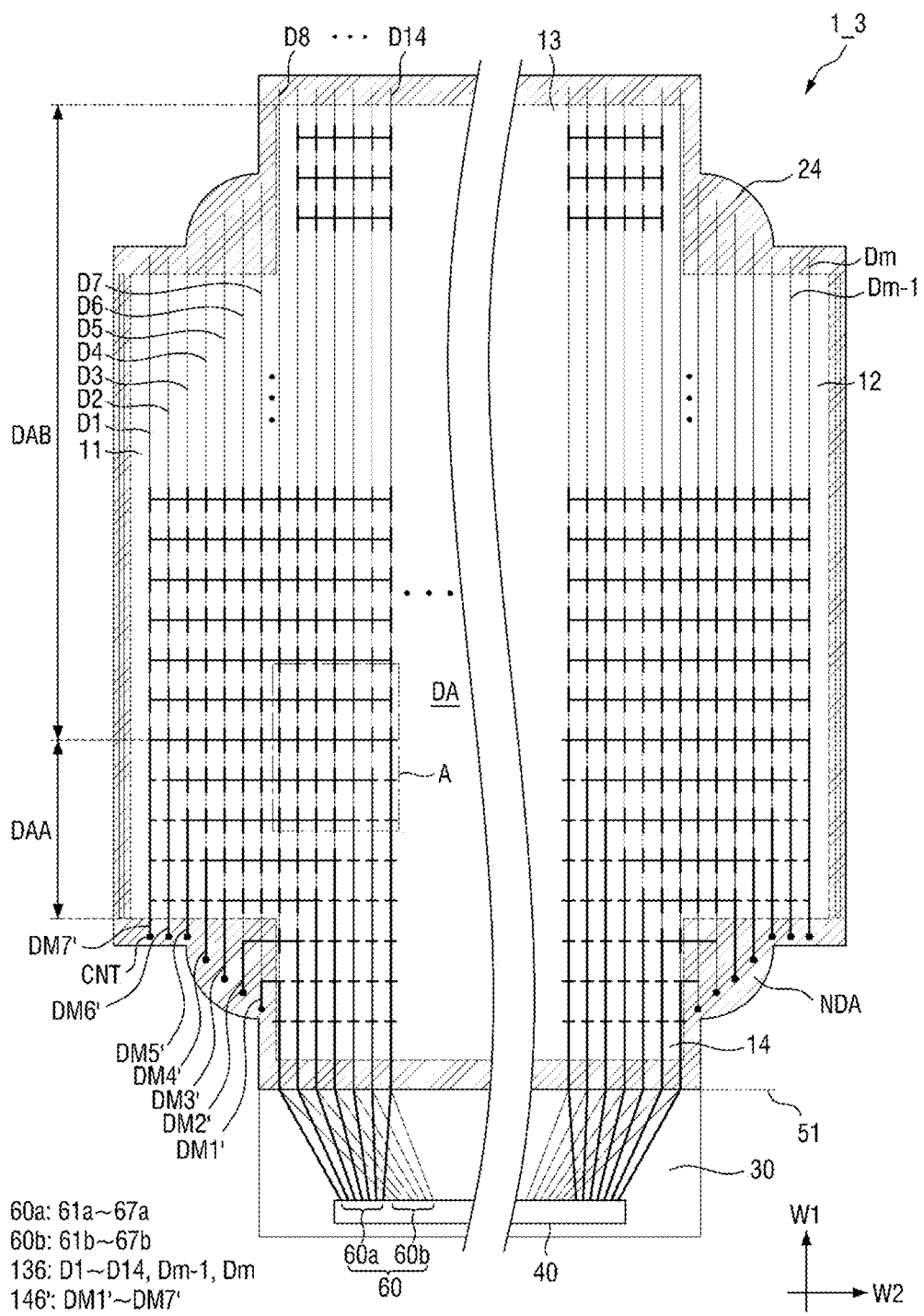
FIG. 15 is a plan view of a display device according to another exemplary embodiment of the invention.
Figure 16:
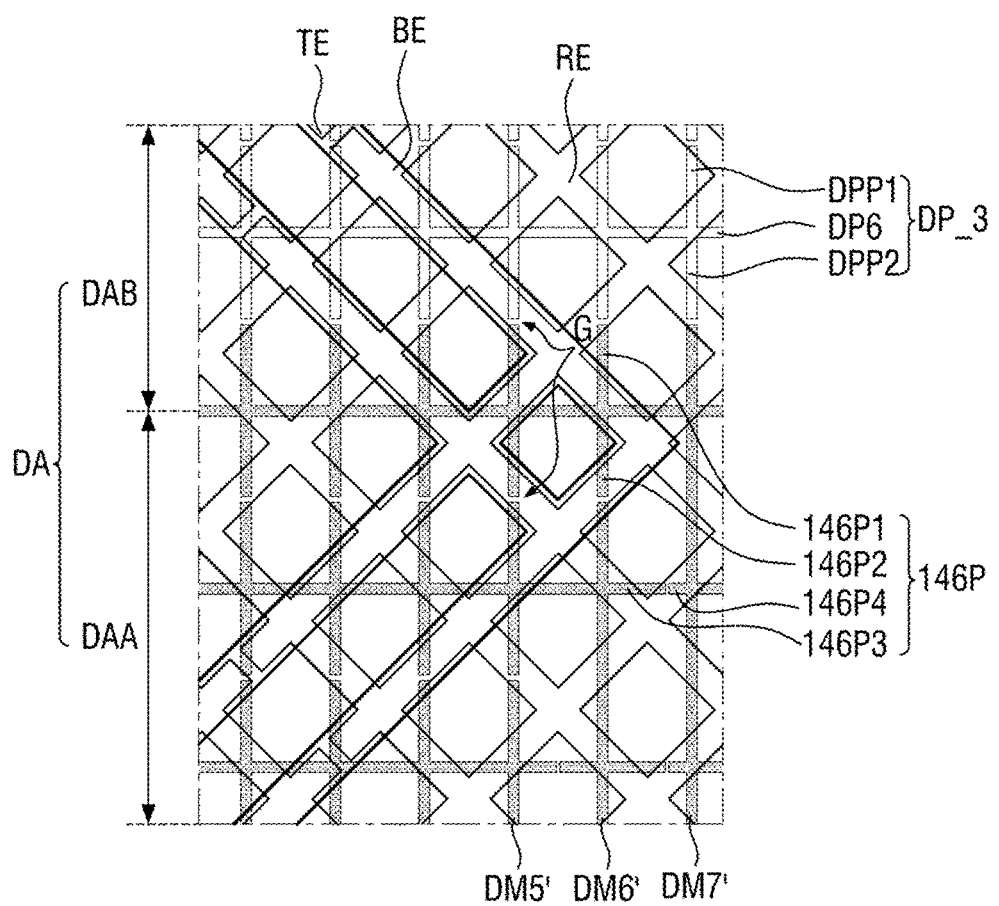
FIG. 16 is an enlarged plan view of an area A of FIG. 15.

FIG. 15 is a plan view of a display device according to another exemplary embodiment of the invention. FIG. 16 is an enlarged plan view of an area A of FIG. 15.

Referring to FIGS. 15 and 16, a display device 1_3 differs from the display device 1 of FIGS. 6 through 10 in that connecting wires 146' include protruding wire patterns 146P, and that dummy patterns DP_3 include first protruding dummy patterns DPP1 and second protruding dummy patterns DPP2.

Specifically, the connecting wires 146' may include the protruding wire patterns 146P in a first area DAA of a display area DA. The protruding wire patterns 146P may include first protruding wire patterns 146P1 which are projected in a first direction W1, second protruding wire patterns 146P2 which are projected in the opposite direction of the first direction W1, third protruding wire patterns 146P3 which are projected in a second direction W2, and fourth protruding wire patterns 146P4 which are projected in the opposite direction of the second direction W2.

The first protruding wire patterns 146P1 may be parallel to the second protruding wire patterns 146P2. Columns of first protruding wire patterns 146P1 may be aligned with columns of second protruding wire patterns 146P2. The first protruding wire patterns 146P1 and the second protruding wire patterns 146P2 may overlap with first through m-th data wires D1 through Dm.

The distance between the first protruding wire patterns 146P1 may be the same as the distance in the second direction W2 between the first through k-th connecting wires DM1 through DMk. Also, the distance between the first protruding wire patterns 146P1 may be the same as the distance in the second direction W2 between the first m-th data wires D1 through Dm.

The distance between the second protruding wire patterns 146P2 may be the same as the distance in the second distance W2 between the first protruding wire patterns 146P1.

The third protruding wire patterns 146P3 may be parallel to the fourth protruding wire patterns 146P4. Rows of third protruding wire patterns 146P3 may be aligned with rows of fourth protruding wire patterns 146P4.

The distance between the third protruding wire patterns 146P3 may be the same as the distance in the first distance W1 between the first through k-th connecting wires DM1 through DMk.

The distance between the fourth protruding wire patterns 146P4 may be the same as the distance in the first distance W1 between the third protruding wire patterns 146P3.

The first protruding wire patterns 146P1 and/or the second protruding wire patterns 146P2 may form a right angle with the third protruding wire patterns 146P3 and/or the fourth protruding wire patterns 146P4.

The first protruding wire patterns 146P1 and/or the second protruding wire patterns 146P2 may have a greater average length than the third protruding wire patterns 146P3 and/or the fourth protruding wire patterns 146P4.

For example, the dummy patterns DP_3 may include, in a second area DAB of the display area DA, sixth dummy patterns DP6, the first protruding dummy patterns DPP1, and the second protruding dummy patterns DPP2, and the first protruding dummy patterns DPP1 and the second protruding dummy patterns DPP2 may be projected from the sixth dummy patterns DP6.

Specifically, the sixth dummy patterns DP6 may extend in the second direction W2, the first protruding dummy patterns DPP1 may be projected from the sixth dummy patterns DP6 in the first direction W1, and the second protruding dummy patterns DPP2 may be projected from the sixth dummy patterns DP6 in the opposite direction of the first direction W1.

The sixth dummy patterns DP6 may be parallel to the second portions of the first through k-th connecting wires DM1 through DMk.

The distance between the sixth dummy patterns DP6 may be the same as the distance in the first direction W1 between the first through k-th connecting wires DM1 through DMk. Also, the distance between the sixth dummy patterns DP6 may be the same as the distance in the first direction W1 between the third protruding wire patterns 146P3 and/or between the fourth protruding wire patterns 146P4.

The first protruding dummy patterns DPP1 may be parallel to the second protruding dummy patterns DPP2. Columns of first protruding dummy patterns DPP1 may be aligned with columns of second protruding dummy patterns DPP2. Also, the columns of first protruding dummy patterns DPP1 and the columns of second protruding dummy patterns DPP2 may be aligned with columns of first protruding wire patterns 146P1 and columns of second protruding wire patterns 146P2.

The first protruding dummy patterns DPP1 and the second protruding dummy patterns DPP2 may overlap with the first through m-th data wires D1 through Dm.

The distance between the first protruding dummy patterns DPP1 may be the same as the distance in the second direction W2 between the first through k-th connecting wires DM1 through DMk. Also, the distance between the first protruding dummy patterns DPP1 may be the same as the distance in the second direction W2 between the first through m-th data wires D1 through Dm. Also, the distance between the first protruding dummy patterns DPP1 may be the same as the distance in the second direction W2 between the first protruding wire patterns 146P1 and/or between the second protruding wire patterns 146P2.

The distance between the second protruding dummy patterns DPP2 may be the same as the distance in the second direction W2 between the first protruding dummy patterns DPP1.

For example, the first protruding wire patterns 146P1 may not overlap with the second protruding wire patterns 146P2. Accordingly, gaps G may be formed between the first protruding wire patterns 146P1 and the second protruding wire patterns 146P2.

Also, the third protruding wire patterns 146P3 may not overlap with the fourth protruding wire patterns 146P4. Accordingly, gaps G may be formed between the third protruding wire patterns 146P3 and the fourth protruding wire patterns 146P4.

Also, the first protruding dummy patterns DPP1 may not overlap with the second protruding dummy patterns DPP2. Accordingly, gaps G may be formed between the first protruding dummy patterns DPP1 and the second protruding dummy patterns DPP2.

As illustrated in FIG. 16, the gaps G formed in the display device 1_3 may overlap with first touch electrodes TE, second touch electrodes RE, and connecting electrodes BE of a touch sensing layer TSL.

As described above, since the connecting wires 146' include the first protruding wire patterns 146P1, the second protruding wire patterns 146P2, the third protruding wire patterns 146P3, and the fourth protruding wire patterns 146P4 and the dummy patterns DP_3 include the first protruding dummy patterns DPP1 and the second protruding dummy patterns DPP2, which are both projected from the sixth protruding dummy patterns DP6, a lattice pattern shape can be formed in and across the display area DA. Also, as described above, since the first touch electrodes TE, the second touch electrodes RE, and the connecting electrodes BE block the gaps G formed in the display area DA, the reflection of external light by the gaps G can be prevented, and smudges caused by the gaps G can be prevented from becoming visible.

FIGS. 15 and 16 illustrate that the sixth dummy patterns DP6 extend in the second direction W2, and that the first protruding dummy patterns DPP1 and the second protruding dummy patterns DPP2 are projected from the sixth dummy patterns DP6 in the first direction W1, but the inventive concept is not limited thereto. Alternatively, the sixth dummy patterns DP6 may extend in the first direction W1, and the first protruding dummy patterns DPP1 and the second protruding dummy patterns DPP2 may be projected from the sixth dummy patterns DP6 in the second direction W2.

A display device according to another exemplary embodiment of the invention will hereinafter be described.

Figure 17:
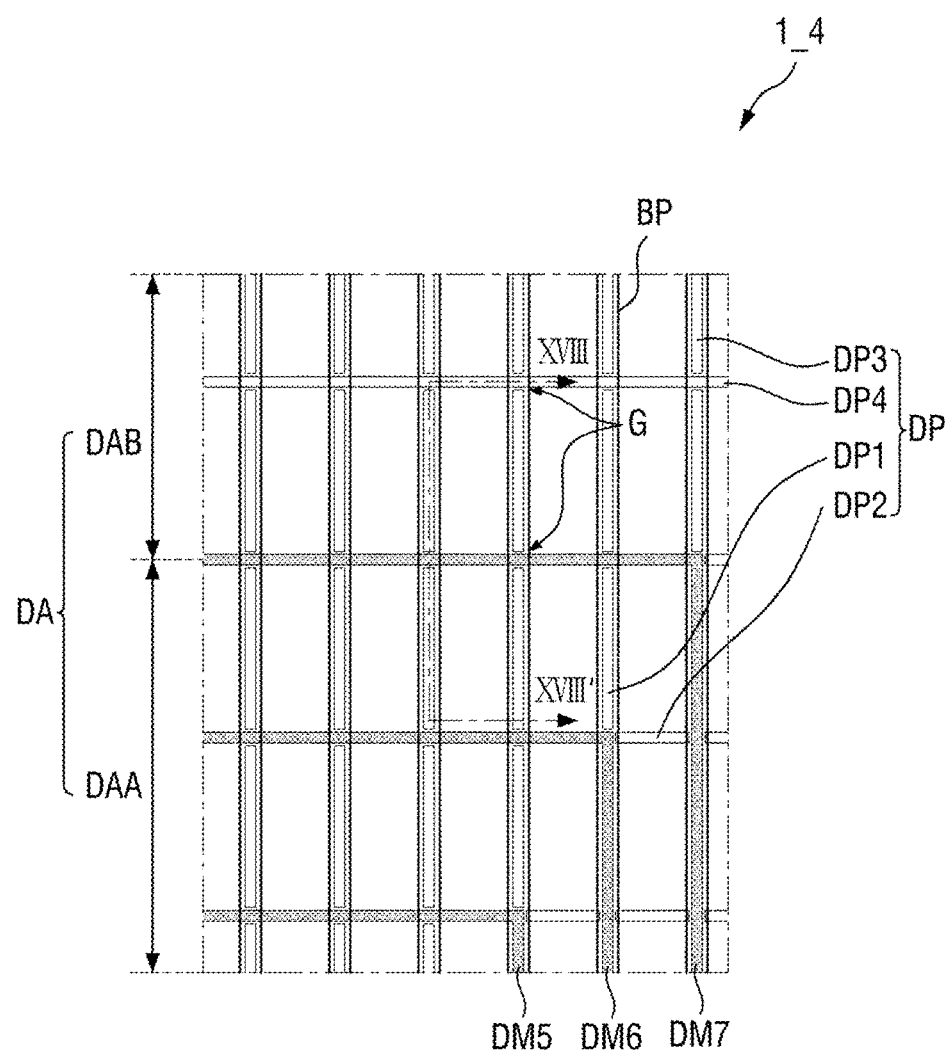
FIG. 17 is a plan view of a display device according to another exemplary embodiment of the invention.
Figure 18:
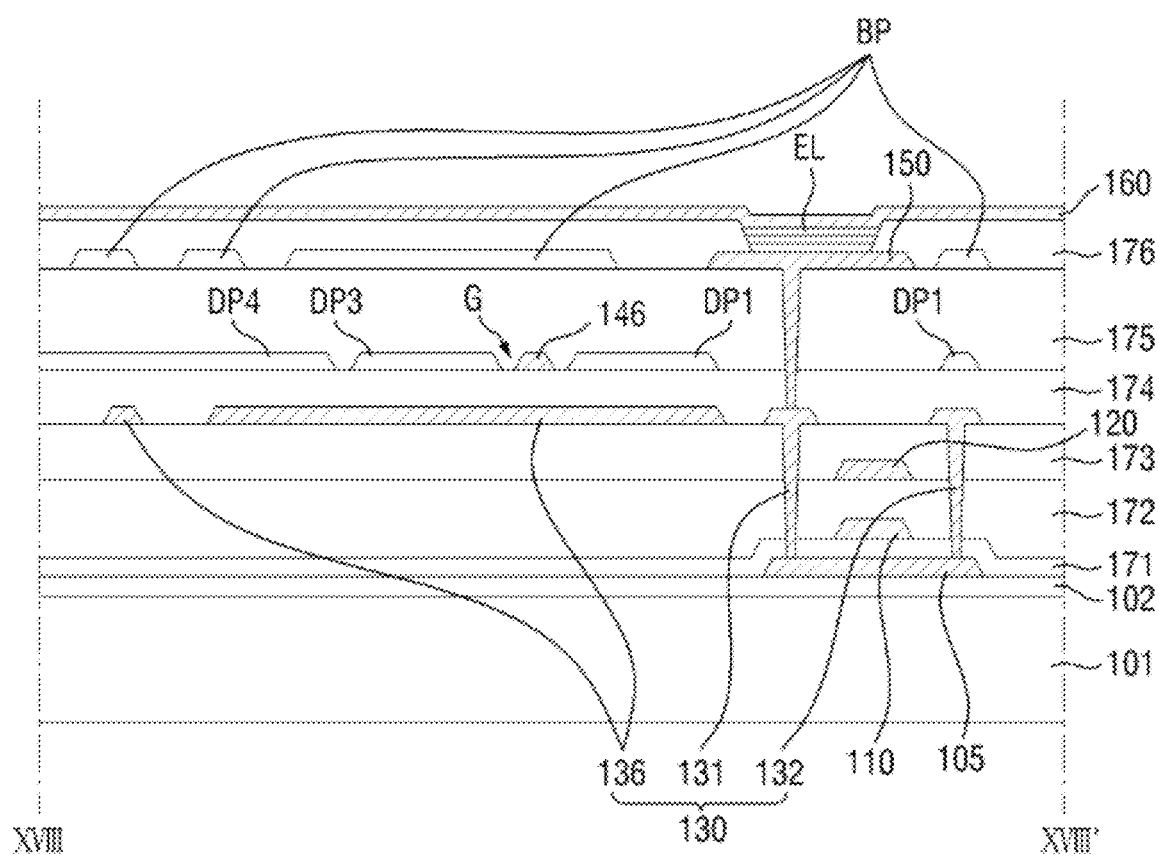
FIG. 18 is an exemplary cross-sectional view taken along line X VIII-X VIII' of FIG. 17.

FIG. 17 is a plan view of a display device according to another exemplary embodiment of the invention. FIG. 18 is an exemplary cross-sectional view taken along line XVIII-X VIII' of FIG. 17.

Referring to FIGS. 17 and 18, a display device 1_4 differs from the display device 1 of FIGS. 4 through 10 in that shielding patterns BP are further disposed on dummy patterns DP.

Specifically, the shielding patterns BP may be disposed in and across a display area DA. The shielding patterns BP may extend in a first direction W1 in a plan view and may be disposed parallel to one another.

The shielding patterns BP may be disposed on a fifth insulating layer 175. The shielding patterns BP may be disposed in the same layer as a first electrode layer 150. The shielding patterns BP may include an opaque conductive material. The shielding patterns BP may receive the same voltage as a first power supply voltage ELVDD which is applied to driving transistors.

The shielding patterns BP may overlap with gaps G formed between the dummy patterns DP and first through k-th connecting wires DM1 through DMk. Also, the shielding patterns BP may overlap with gaps G formed between the dummy patterns DP. Accordingly, since the shielding patterns BP block the gaps G between the dummy patterns DP and between the dummy patterns DP and connecting wires 146, smudges caused by the gaps G can be prevented from becoming visible.

FIGS. 17 and 18 illustrate that the shielding patterns BP are formed as column patterns extending in the first direction W1, but the present disclosure is not limited thereto. Alternatively, the shielding patterns BP may be formed as row patterns extending in the second direction W2 or as lattice patterns consisting of column patterns extending in the first direction W1 and row patterns extending in the second direction W2.

Figure 19:
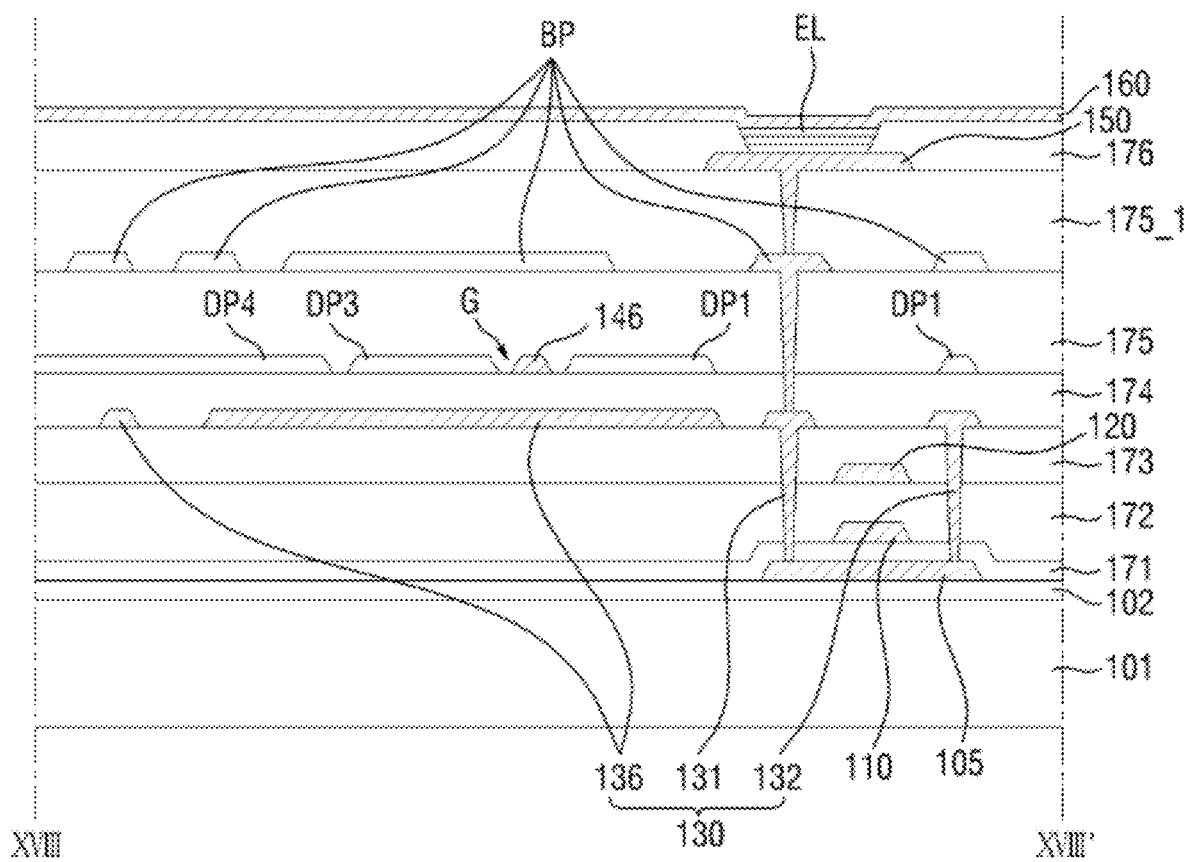
FIG. 19 is another exemplary cross-sectional view taken along line X VIII-X VIII' of FIG. 17.

A display device according to another exemplary embodiment of the invention will hereinafter be described. FIG. 19 is another exemplary cross-sectional view taken along line X VIII-X VIM of FIG. 17.

Referring to FIG. 19, a display device 1_5 differs from the display device 1_4 of FIGS. 17 and 18 in that shielding patterns BP' are disposed on a sixth insulating layer 175'.

The sixth insulating layer 175' may be disposed between a fifth insulating layer 175 and a first electrode layer 150. The sixth insulating layer 175' may be formed as a via layer together with the fifth insulating layer 175.

As already described above, the shielding patterns BP' may be disposed on the sixth insulating layer 175'. Since the shielding patterns BP' block gaps G formed in a display area DA, the reflection of external light by the gaps G can be prevented, and smudges caused by the gaps G can be prevented from becoming visible.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device including a display area and a non-display area, the display device comprising:
first touch electrodes disposed in the display area and arranged in a first direction;
second touch electrodes disposed in the display area and arranged in a second direction that intersects the first direction;
connecting electrodes connecting the first touch electrodes;
a plurality of data wires disposed in the display area and in the non-display area;
a plurality of connecting wires connected to the data wires;
dummy patterns disposed in the same layer as the connecting wires; and
a plurality of pixels disposed in the display area,
wherein:
first gaps are defined between the connecting wires and the dummy patterns; and
the first touch electrodes, the second touch electrodes, and the connecting electrodes overlap with the first gaps.

2. The display device of claim 1, further comprising a pixel-defining layer defining the pixels,
wherein the first touch electrodes, the second touch electrodes, and the connecting electrodes overlap with the pixel-defining layer.

3. The display device of claim 1, wherein:
the dummy patterns comprise first dummy patterns which are disposed between the connecting wires and second dummy patterns which are separated from the first dummy patterns;
second gaps are defined between the first dummy patterns and the second dummy patterns; and
the first touch electrodes, the second touch electrodes, and the connecting electrodes overlap with the second gaps.

4. The display device of claim 3, wherein:
the display area includes a first area in which the connecting wires are disposed and a second area which accounts for the rest of the display area: and
the dummy patterns further comprise third dummy patterns which are disposed in the second area and fourth dummy patterns which are separated from the third dummy patterns.

5. The display device of claim 4, wherein:
third gaps are defined between the third dummy patterns and the fourth dummy patterns: and
the first touch electrodes, the second touch electrodes, and the connecting electrodes overlap with the third gaps.

6. The display device of claim 1, wherein:
the connecting wires comprise a plurality of protruding wire patterns which are projected from first sides of the connecting wires;
fourth gaps are defined between the protruding wire patterns; and
the first touch electrodes, the second touch electrodes, and the connecting electrodes overlap with the fourth gaps.

7. The display device of claim 6, wherein:
the protruding wire patterns comprise first protruding wire patterns which are projected in a first direction and second protruding wire patterns which are projected in the opposite direction of the first direction; and
the fourth gaps are disposed between the first protruding wire patterns and the second protruding wire patterns.

8. The display device of claim 6, wherein:
the protruding wire patterns comprise third protruding wire patterns which are projected in a second direction that intersects the first direction and fourth protruding wire patterns which are projected in the opposite direction of the second direction; and
the fourth gaps are disposed between the third protruding wire patterns and the fourth protruding wire patterns.

9. The display device of claim 6, wherein:
the dummy patterns comprise sixth dummy patterns and first protruding dummy patterns and second protruding dummy patterns which are both projected from the sixth dummy patterns;
fifth gaps are defined between the first protruding dummy patterns and the second protruding dummy patterns; and
the first touch electrodes, the second touch electrodes, and the connecting electrodes overlap with the fifth gaps.

* * * * *